US012610523B2

(12) United States Patent
Jeong et al.

(10) Patent No.: US 12,610,523 B2
(45) Date of Patent: Apr. 21, 2026

(54) SEMICONDUCTOR MEMORY DEVICES

(71) Applicant: Samsung Electronics Co., Ltd.,
Suwon-si (KR)

(72) Inventors: Euichul Jeong, Yongin-si (KR); **Kiseok
Lee, Hwaseong-si (KR); Wonki Roh**,
Yongin-si (KR); Hyungeun Choi,
Suwon-si (KR)

(73) Assignee: Samsung Electronics Co., Ltd.,
Suwon-si (KR)

( * ) Notice: Subject to any disclaimer, the term of this
patent is extended or adjusted under 35
U.S.C. 154(b) by 733 days.

(21) Appl. No.: 18/059,492

(22) Filed: Nov. 29, 2022

(65) Prior Publication Data

US 2023/0180456 A1 Jun. 8, 2023

(30) Foreign Application Priority Data

Dec. 3, 2021 (KR) ........................ 10-2021-0172266

(51) Int. Cl.
*H10B 63/00* (2023.01)
*H10B 12/00* (2023.01)
(52) U.S. Cl.
CPC ............. *H10B 12/30* (2023.02); *H10B 12/03*
(2023.02); *H10B 12/05* (2023.02); *H10B
12/482* (2023.02)
(58) Field of Classification Search
CPC ........ H10B 12/30; H10B 12/03; H10B 12/05;
H10B 12/482; H10B 12/488; H10B 12/50
See application file for complete search history.

(56) References Cited

U.S. PATENT DOCUMENTS 5,773,892 A * 6/1998 Morikawa .............. H10B 10/00
257/E27.098
7,037,850 B2 5/2006 Lee et al.
(Continued)

FOREIGN PATENT DOCUMENTS

JP 2004-087671 A 3/2004
KR 101094061 B1 12/2011
(Continued)

OTHER PUBLICATIONS

Taiwanese Office Action dated Jul. 5, 2023 issued in Taiwanese
Patent Application No. 111146363.
(Continued)

*Primary Examiner* — Samuel Park
(74) *Attorney, Agent, or Firm* — Fish & Richardson P.C.

(57) ABSTRACT
A semiconductor memory device including a transistor body
extending in a first horizontal direction and including a first
source/drain region, a single-crystal channel layer, and a
second source/drain region sequentially arranged in the first
horizontal direction, a gate electrode layer extending in a
second horizontal direction orthogonal to the first horizontal
direction and covering upper and lower surfaces of the
single-crystal channel layer, a bit line connected to the first
source/drain region, extending in a vertical direction, and
having a first width in the second horizontal direction, a
spacer covering upper and lower surfaces of the first source/
drain region and having a second width greater than the first
width, and a cell capacitor on a side opposite to the bit line
with respect to the transistor body in the first horizontal
direction and including lower and upper electrode layers and
a capacitor dielectric layer therebetween may be provided.

19 Claims, 23 Drawing Sheets

(56)                  References Cited

U.S. PATENT DOCUMENTS

| | | | |
|---|---|---|---|
| 8,368,137 | B2 | 2/2013 | Mokhlesi et al. |
| 10,861,854 | B2 | 12/2020 | Kim et al. |
| 11,501,827 | B2 | 11/2022 | Kim et al. |
| 11,502,086 | B2 | 11/2022 | Son et al. |
| 2021/0134802 | A1 | 5/2021 | Gomes et al. |
| 2021/0159229 | A1 | 5/2021 | Gomes et al. |
| 2021/0193666 | A1 | 6/2021 | Gomes et al. |
| 2021/0272624 | A1 | 9/2021 | Gomes et al. |
| 2021/0375926 | A1 | 12/2021 | Mehandru et al. |
| 2022/0077151 | A1* | 3/2022 | Lee ..................... H10B 12/482 |
| 2022/0208766 | A1* | 6/2022 | Kim ..................... H10B 12/30 |
| 2023/0125896 | A1* | 4/2023 | Kim .................. H10D 30/0415 |
| | | | 257/296 |

FOREIGN PATENT DOCUMENTS

| | | | |
|---|---|---|---|
| KR | 10-2020-0105216 A | 9/2020 | |
| KR | 10-2021-0077098 A | 6/2021 | |

OTHER PUBLICATIONS

Office Action in Korean Appln. No. 10-2021-0172266, mailed on Jun. 20, 2025, 12 pages (with English translation).

* cited by examiner

STR1

STR2

STR1

STR2

SEMICONDUCTOR MEMORY DEVICES

CROSS-REFERENCE TO RELATED APPLICATION

This application is based on and claims priority under 35 U.S.C. § 119 to Korean Patent Application No. 10-2021-0172266, filed on Dec. 3, 2021, in the Korean Intellectual Property Office, the disclosure of which is incorporated by reference herein in its entirety.

BACKGROUND

The inventive concepts relate to a semiconductor memory devices, and more particularly, to three-dimensional semiconductor memory devices.

As miniaturization, multi-functionality, and high performance of electronic products are required, a high-capacity semiconductor memory device is required, and an increased degree of integration is required to provide the high-capacity semiconductor memory device. Since the density of a conventional 2-dimensional (2D) semiconductor memory device is mainly determined by the area occupied by a unit memory cell, there is a limitation in increasing the density by the conventional 2D semiconductor memory device. Accordingly, a three-dimensional semiconductor memory device that increases memory capacity by stacking a plurality of memory cells on a substrate in a vertical direction has been proposed.

SUMMARY

The inventive concepts provide three-dimensional semiconductor memory devices with improved integration.

According to an example embodiment of the inventive concepts, a semiconductor memory device includes a transistor body extending in a first horizontal direction on a substrate, the transistor body including a first source/drain region, a single-crystal channel layer, and a second source/drain region sequentially arranged in the first horizontal direction, a gate electrode layer extending in a second horizontal direction orthogonal to the first horizontal direction, the gate electrode layer covering upper and lower surfaces of the single-crystal channel layer, a bit line connected to the first source/drain region and extending in a vertical direction, the bit line having a first width in the second horizontal direction, a spacer covering upper and lower surfaces of the first source/drain region and having a second width that is greater than the first width in the second horizontal direction, and a cell capacitor on a side opposite to the bit line with respect to the transistor body in the first horizontal direction, the cell capacitor including a lower electrode layer connected to the second source/drain region, a capacitor dielectric layer, and an upper electrode layer.

According to an example embodiment of the inventive concepts, a semiconductor memory device includes a plurality of transistor bodies spaced apart from each other in a vertical direction on a substrate and extending parallel to each other in a first horizontal direction, each of the plurality of transistor bodies including a first source/drain region, a single-crystal channel layer, and a second source/drain region sequentially arranged in the first horizontal direction, each of the plurality of transistor bodies having a protrusion convexly protruding in a second horizontal direction orthogonal to the first horizontal direction, a plurality of bit lines spaced apart from each other in the second horizontal direction on the substrate, extending parallel to each other in the vertical direction, and each of the plurality of bit lines connected to the first source/drain region of a corresponding one of the plurality of transistor bodies, a plurality of word lines spaced apart from each other in the vertical direction, extending parallel to each other in the second horizontal direction, the plurality of word lines having a gate insulating layer therebetween, and each of the plurality of word lines covering at least upper and lower surfaces of the single-crystal channel layer of a corresponding one of the plurality of transistor bodies, a plurality of spacers each being on an upper surface and a lower surface of a corresponding one of the first source/drain region, and each of the plurality of spacers including a first sidewall in contact with a corresponding one of the plurality of bit lines, and a plurality of cell capacitors each connected to the second source/drain region of a corresponding one of the plurality of transistor bodies, each of the plurality of cell capacitors including a first electrode, a capacitor dielectric layer, and a second electrode, wherein each of the plurality of bit lines has a first width in the second horizontal direction, and each of the plurality of spacers has a second width in the second horizontal direction that is greater than the first width of each of the plurality of the bit lines.

According to an example embodiment of the inventive concepts, a semiconductor memory device includes a plurality of transistor bodies spaced apart from each other in a vertical direction on a substrate and extending parallel to each other in a first horizontal direction, each of the plurality of transistor bodies including a first source/drain region, a single-crystal channel layer including single-crystal silicon, and a second source/drain region sequentially arranged in the first horizontal direction, each of the plurality of transistor bodies having a protrusion with a planar shape convexly protruding in a second horizontal direction orthogonal to the first horizontal direction, a part of each of the plurality of transistor bodies being a part of the single-crystal channel layer, a plurality of bit lines spaced apart from each other in the second horizontal direction on the substrate and extending parallel to each other in the vertical direction, each of the plurality of bit lines connected to the first source/drain region of a corresponding one of the plurality of transistor bodies, each of the plurality of bit lines having a first width in the second horizontal direction, a plurality of word lines spaced apart from each other along the vertical direction and extending parallel to each other in the second horizontal direction, the plurality of word lines having a gate insulating layer therebetween, and each of the plurality of word lines covering at least an upper surface of the single-crystal channel layer of a corresponding one of the plurality of transistor bodies or a lower surface of the single-crystal channel layer of a corresponding one of the plurality of transistor bodies, a spacer covering upper and lower surfaces of the first source/drain region and having a second width in the second horizontal direction that is greater than the first width, and a plurality of cell capacitors each including a first electrode connected to the second source/drain region of a corresponding one of the plurality of transistor bodies, a second electrode covering the first electrode, and a capacitor dielectric layer between the first electrode and the second electrode.

BRIEF DESCRIPTION OF THE DRAWINGS

Some example embodiments of the inventive concepts will be more clearly understood from the following detailed description taken in conjunction with the accompanying drawings in which:

FIGS. 12A to 19 are schematic diagrams illustrating a method of manufacturing a semiconductor memory device, according to an example embodiment;

FIGS. 12A, 13A, and 14A are plan views at the first vertical level LV1 of FIG. 2.

FIG. 14C is a cross-sectional view taken along line C-C' of FIG. 14A; and FIGS. 15 to 19 are cross-sectional views corresponding to a cross-section taken along line B-B' of FIG. 14A.

DETAILED DESCRIPTION

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, some example embodiments of the technical idea of the inventive concepts will be described in detail with reference to the accompanying drawings.

Figure 1:
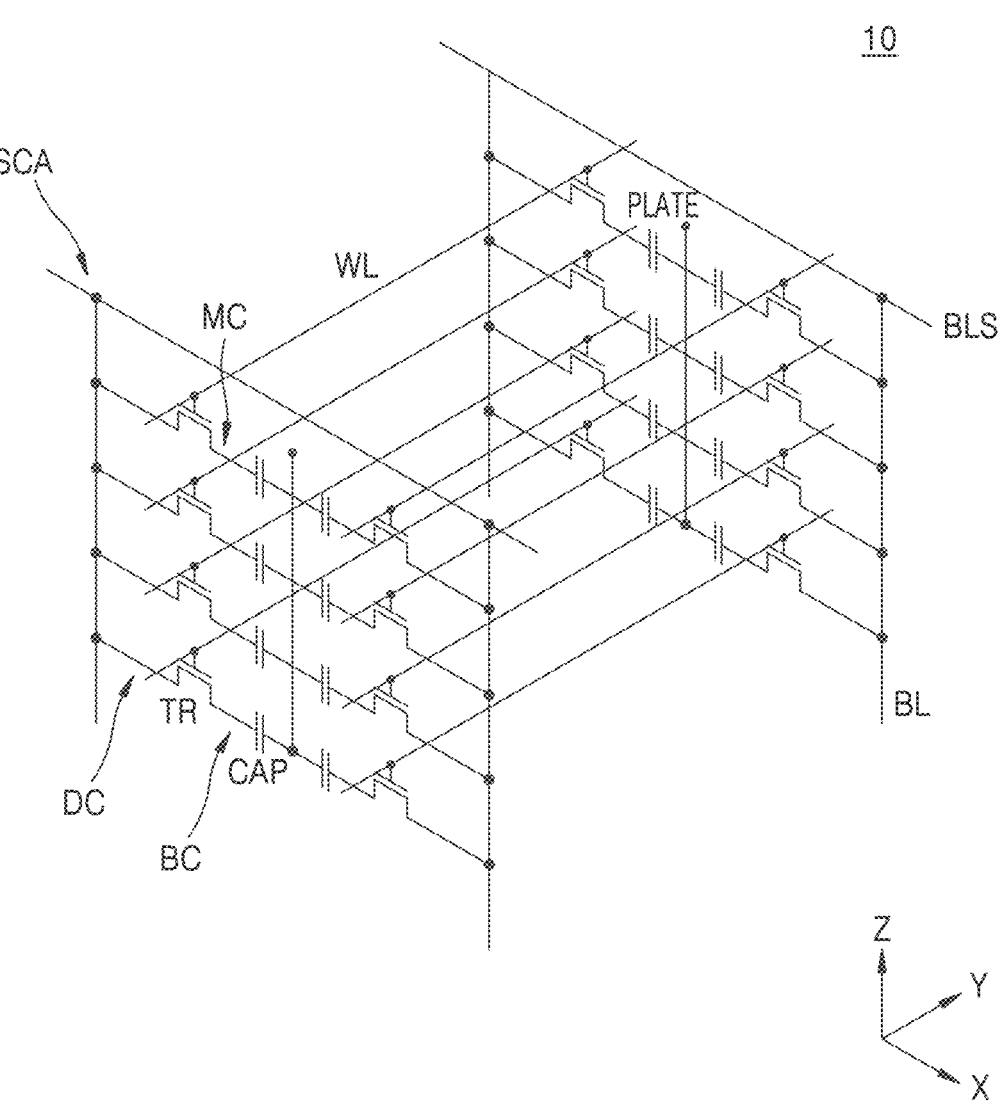
FIG. 1 is an equivalent circuit diagram illustrating a cell array of a semiconductor memory device according to an example embodiment.

FIG. 1 is an equivalent circuit diagram illustrating a cell array of a semiconductor memory device according to an example embodiment.

Referring to FIG. 1, a semiconductor memory device 10 may include a plurality of memory cells MC configured by a cell transistor TR and a cell capacitor CAP arranged in the first horizontal direction X and connected to each other. The plurality of memory cells MC may be spaced apart from each other in each of the first horizontal direction X and the vertical direction Z and arranged in a column to configure a sub-cell array SCA. Moreover, in the semiconductor memory device 10, a plurality of sub-cell arrays SCA may be disposed to be spaced apart from each other in the second horizontal direction Y.

A plurality of word lines WL may extend in the second horizontal direction Y, and may be spaced apart from each other in the first horizontal direction X and the vertical direction Z. A plurality of bit lines BL may extend in the vertical direction Z and may be spaced apart from each other in the first horizontal direction X and the second horizontal direction Y, respectively.

In some example embodiments, some of the plurality of bit lines BL may be connected to each other by a bit line strapping line BLS extending in the first horizontal direction X. For example, the bit line strapping line BLS may connect the bit lines BL arranged in the first horizontal direction X among the plurality of bit lines BL to each other.

Figure 2:
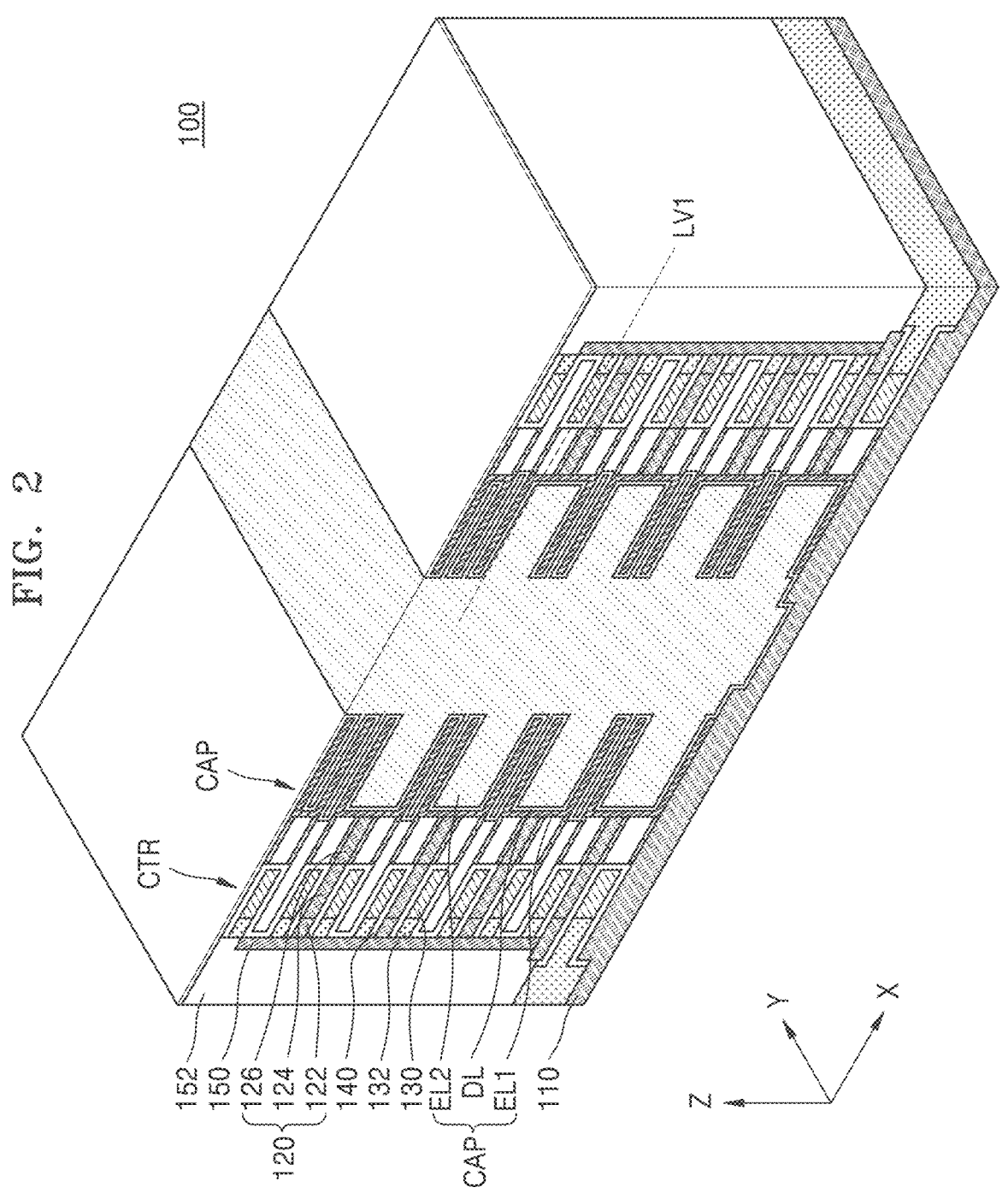
FIG. 2 is a perspective view illustrating a semiconductor memory device according to an example embodiment.

The plurality of cell capacitors CAP may be commonly connected to the upper electrode PLATE extending in the second horizontal direction Y and the vertical direction Z. In FIG. 2, for convenience of illustration, the upper electrode PLATE is illustrated as extending in the vertical direction Z, but the upper electrode PLATE arranged in the second horizontal direction Y may form an integral body.

Figure 3:
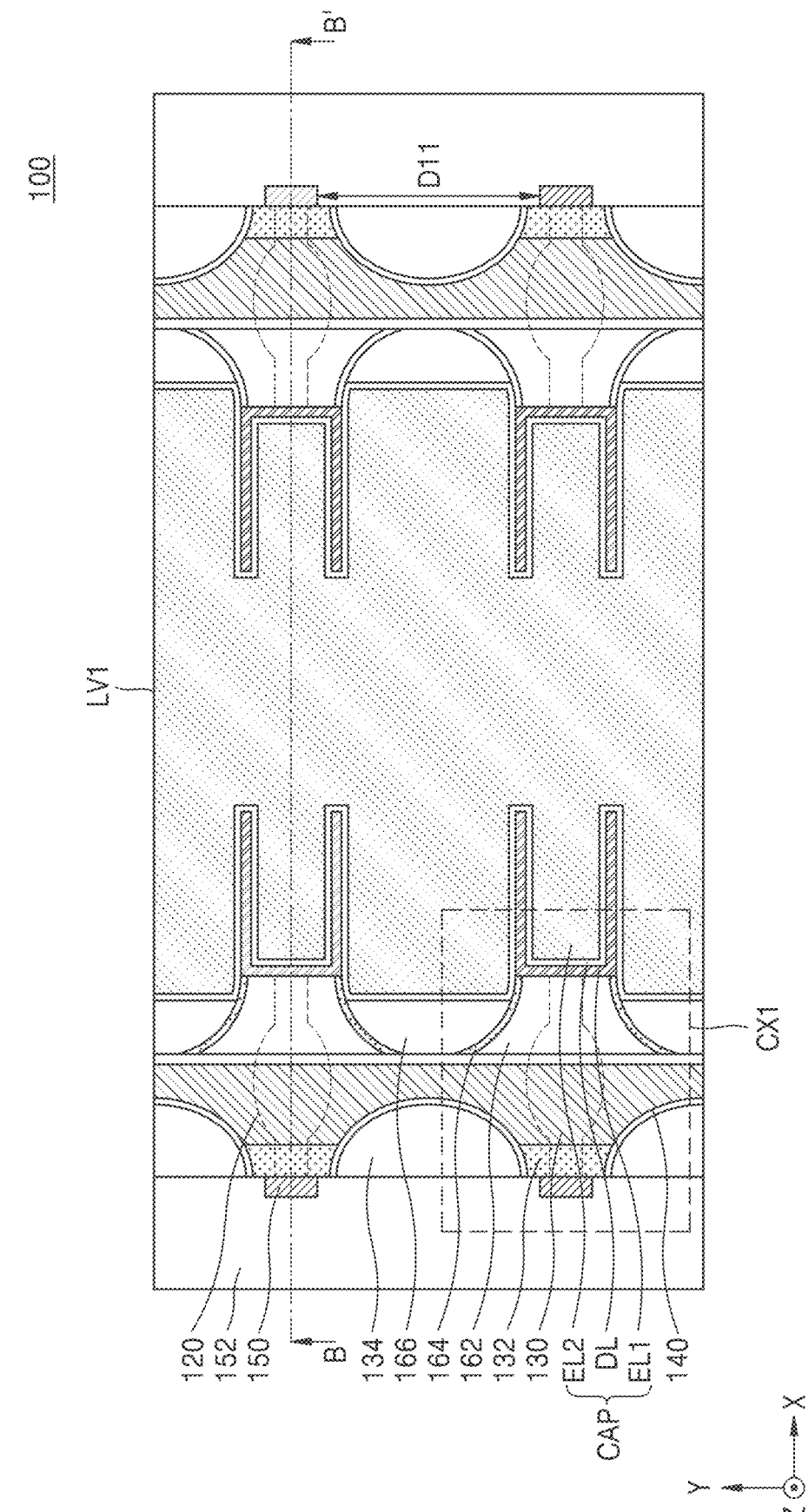
FIG. 3 is a plan view at the vertical level of FIG. 2.
Figure 4:
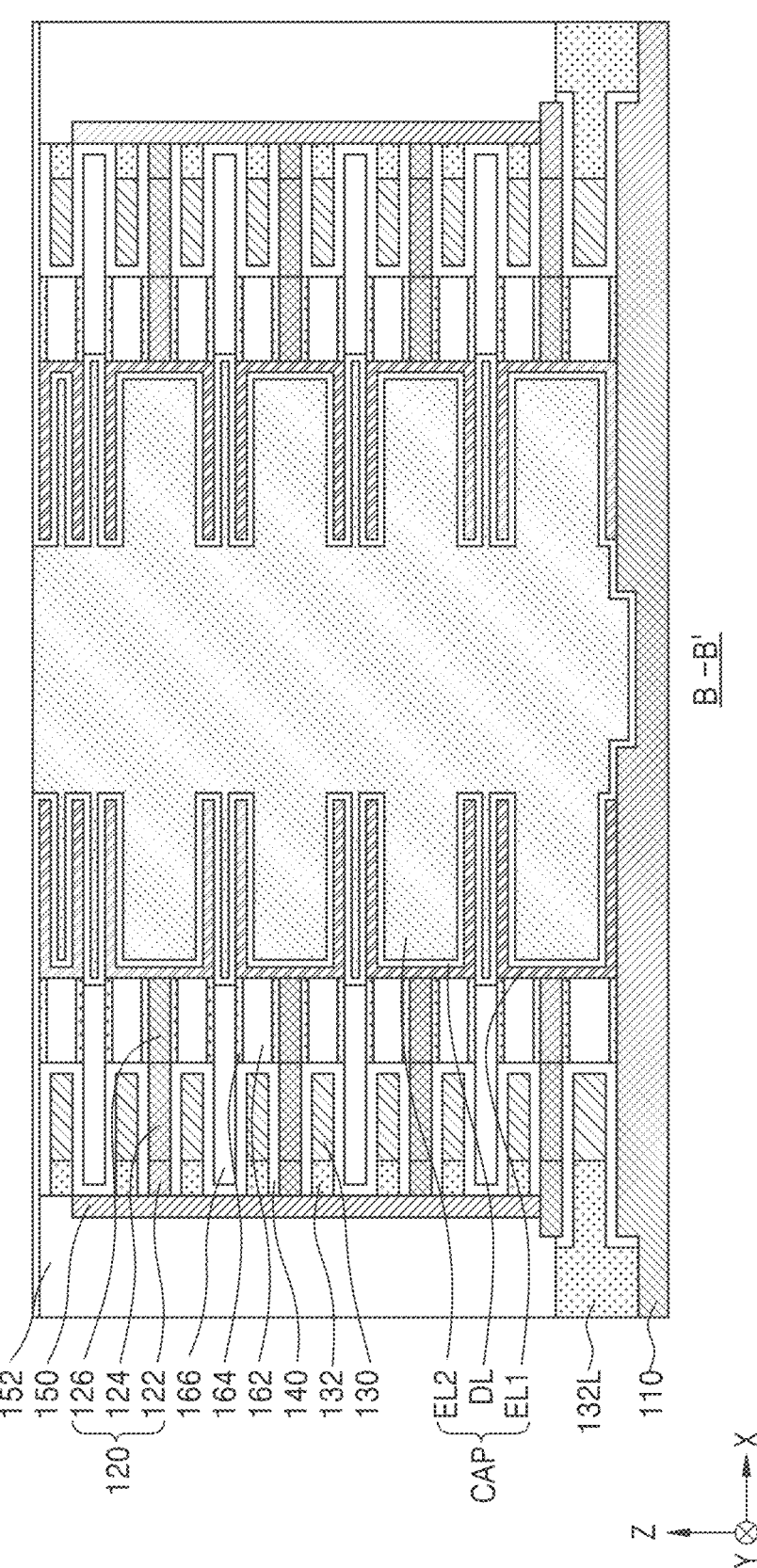
FIG. 4 is a cross-sectional view taken along line B-B' of FIG. 3.
Figure 5:
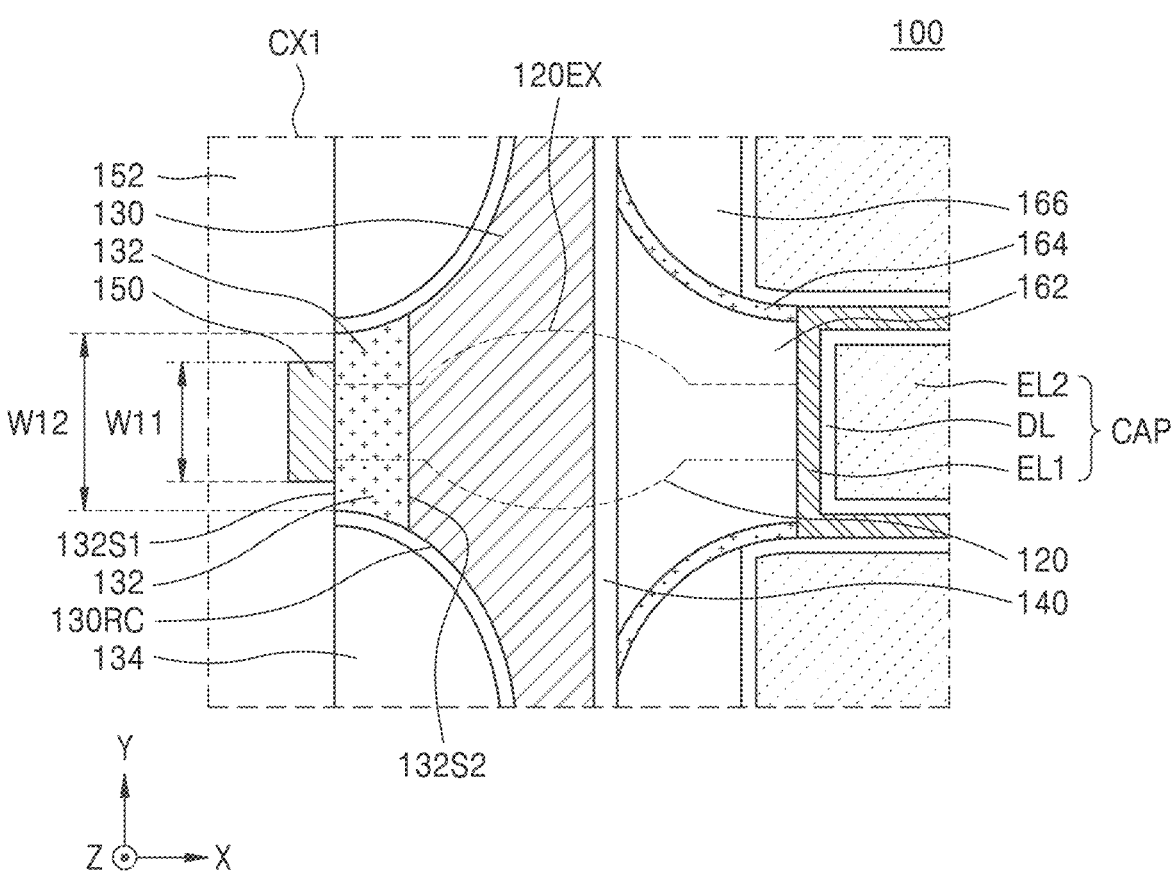
FIG. 5 is an enlarged view of a portion CX1 of FIG. 3.

FIG. 2 is a perspective view illustrating a semiconductor memory device 100 according to an example embodiment. FIG. 3 is a plan view at the vertical level LV1 of FIG. 2. FIG. 4 is a cross-sectional view taken along line B-B' of FIG. 3. FIG. 5 is an enlarged view of a portion CX1 of FIG. 3.

Referring to FIGS. 2 to 5, the semiconductor memory device 100 may include a plurality of cell transistors CTR and a plurality of cell capacitors CAP disposed on a substrate 110.

Each of the plurality of cell transistors CTR may include a transistor body 120, a word line 130, a gate insulating layer 140, and a bit line 150, and the plurality of cell capacitors CAP may include a first electrode EL1 a second electrode EL2, and a capacitor dielectric layer DL.

The substrate 110 may include silicon (Si), germanium (Ge), or silicon germanium (SiGe). In some example embodiments, for example, the substrate 110 may include a silicon-on-insulator (SOI) substrate or a germanium-on-insulator (GeOI) substrate.

Although not shown in the drawing, a peripheral circuit (not shown) and a wiring layer (not shown) connected to the peripheral circuit may be further formed on a partial region of the substrate 110. For example, the peripheral circuit may include a planar metal-oxide-semiconductor field-effect transistor (MOSFET) constituting a sub word line driver, a sense amplifier, and the like, but is not limited thereto. Although not shown in the drawing, a lower insulating layer (not shown) disposed to cover the peripheral circuit and a wiring layer may be further formed on the substrate 110.

A plurality of transistor bodies 120 may extend in the first horizontal direction X and may be disposed to be spaced apart from each other in the vertical direction Z on the substrate 110. The plurality of transistor bodies 120 may be formed of, for example, an undoped semiconductor material or a doped semiconductor material. In some example embodiments, the plurality of transistor bodies 120 may be made of polysilicon. In some example embodiments, the plurality of transistor bodies 120 may include an amorphous metal oxide, a polycrystalline metal oxide, or a combination of an amorphous metal oxide and a polycrystalline metal oxide, and the like, and for example, may include at least one of In—Ga-based oxide (IGO), In—Zn-based oxide (IZO), or In—Ga—Zn-based oxide (IGZO).

The plurality of transistor bodies 120 may include a first source/drain region 122, a single-crystal channel layer 124, and a second source/drain region 126 that are sequentially arranged in the first horizontal direction X. For example, the first source/drain region 122 may be connected to the bit line 150 and the second source/drain region 126 may be connected to the first electrode EL1 of the cell capacitor CAP. The first source/drain region 122 and the second source/drain region 126 may include a semiconductor material doped with a high concentration of n-type impurities.

As illustrated by a dashed line in FIG. 5, the plurality of transistor bodies 120 may have a planar shape including a protrusion 120EX extending outward from a central portion. For example, the protrusion 120EX may be defined by a portion of a sidewall of the second source/drain region 126 and a sidewall of the single-crystal channel layer 124. In other words, the transistor body 120 has a protrusion 120EX having a planar shape protruding convexly in the second horizontal direction (Y direction). A part of the protrusion is a part of the single-crystal channel layer 124, and a remainder of the protrusion is a part of the second source/drain region 126.

However, in other example embodiments, the plurality of transistor bodies 120 may have a line shape or a bar shape without protrusions extending outward. Upper and bottom surfaces of the plurality of transistor bodies 120 may have a flat shape extending in the first horizontal direction X.

The plurality of word lines 130 may be disposed adjacent to the plurality of transistor bodies 120 to extend in the second horizontal direction Y. The semiconductor memory device 100 may have a dual gate transistor structure, and as shown in FIG. 2, each of the plurality of word lines 130 may be disposed on the upper and bottom surfaces of the plurality of transistor bodies 120. In other words, each of the plurality of word lines 130 covers at least an upper surface of the single-crystal channel layer 124 of a corresponding one of the plurality of transistor bodies 120 and a lower surface of the single-crystal channel layer 124 of a corresponding one of the plurality of transistor bodies 120. As shown in FIG. 5, each word line 130 in a plan view may have a curved sidewall 130RC in an area adjacent to the bit line 150, and the curved sidewall 130RC may have an elliptical or circular arc shape.

In some example embodiments, the plurality of word lines 130 may include a conductive barrier film and a conductive filling layer covering the conductive barrier film. The conductive barrier film may include, for example, a metal, a conductive metal nitride, a conductive metal silicide, or a combination thereof. For example, the conductive barrier film may be made of TiN. The conductive filling layer may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof. In some example embodiments, the conductive filling layer may include tungsten (W).

A spacer 132 may be disposed between each of the plurality of bit lines 150 and a corresponding one of the word lines 130 adjacent thereto. The spacer 132 may be disposed at the same vertical level as the word line 130, a first sidewall 132S1 of the spacer 132 may contact the bit line 150, and a second sidewall 132S2 of the spacer 132 may contact the word line 130. The spacer 132 vertically overlaps the first source/drain region 122. As shown in FIG. 5, the sidewall of the spacer 132 and the curved sidewall 130RC of the word line 130 may form a circular or elliptical arc together with each other.

In some example embodiments, the portion of the spacer 132 in contact with the lowermost word line 130 may extend onto the upper surface of the substrate 110 and may have a greater thickness than the remaining spacers 132. The spacer 132 extending on the upper surface of the substrate 110 may be referred to as a bottom spacer layer 132L. The spacer 132 and the bottom spacer layer 132L may include silicon nitride, silicon oxynitride, or silicon oxide.

A buried insulating layer 134 may be disposed adjacent to the curved sidewall 130RC of the word line 130 and the spacer 132 to extend in the vertical direction Z. As shown in FIG. 5, the buried insulating layer 134 may have a semi-circular or semi-elliptical horizontal cross-section, and the sidewall of the spacer 132 and the curved sidewall 130RC of the word line 130 may form a circular or elliptical arc together with each other and surround the sidewall of the buried insulating layer 134.

FIG. 5 shows as an example that the curved sidewall 130RC of the word line 130 is disposed close to the bit line 150 and a planar sidewall opposite the curved sidewall 130RC of the word line 130 is disposed away from the bit line 150. However, in other example embodiments, the curved sidewall 130RC of the word line 130 may be disposed away from the bit line 150 and a planar sidewall (not shown) opposite to the curved sidewall 130RC of the word line 130 may be disposed close to the bit line 150.

The gate insulating layer 140 may be arranged between the plurality of word lines 130 and the transistor body 120. For example, the gate insulating layer 140 may conformally cover an upper surface, a bottom surface, and a side surface of each of the plurality of word lines 130.

In some example embodiments, the gate insulating layer 140 may be formed of at least one selected from a ferroelectric material and a high-k dielectric material having a dielectric constant higher than that of silicon oxide. In some example embodiments, the gate insulating layer 140 may include at least one selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), Zirconium Oxide (ZrO), Zirconium Silicate (ZrSiO), Zirconium Oxide Nitride (ZrON), Zirconium Silicon Oxide Nitride (ZrSiON), Tantalum Oxide (TaO), Titanium Oxide (TiO), Barium Strontium Titanium Oxide (BaSrTiO), Barium Titanium Oxide (BaTiO), Lead zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO).

A spacer buried layer 162 may be disposed between each of the plurality of transistor bodies 120, and may be disposed at the same vertical level as the plurality of word lines 130. A spacer liner layer 164 may be disposed on the upper and bottom surfaces of the spacer buried layer 162, and a separation insulating layer 166 may be disposed between two adjacent spacer buried layers 162 and between two adjacent word lines 130. For example, a gate insulating layer 140 may be arranged between the separation insulating layer 166 and the word line 130, and a spacer liner layer 164 may be disposed between the separation insulating layer 166 and the spacer buried layer 162.

The plurality of bit lines 150 may extend in the vertical direction Z on the substrate 110 and may be disposed to be spaced apart from each other in the second horizontal direction Y. The plurality of bit lines 150 may be any one of doped semiconductor materials such as silicon doped with impurities, germanium doped with impurities, a conductive metal nitride such as titanium nitride and tantalum nitride, a metal such as tungsten, titanium, and tantalum, and a metal-semiconductor compound such as tungsten silicide, cobalt silicide, and titanium silicide.

In some example embodiments, the plurality of bit lines 150 may have a width smaller than a width of the spacer 132. For example, the bit line 150 may have a first width W11 in the second horizontal direction Y, and the spacer 132 may have a second width W12 that is greater than the first width W11 in the second horizontal direction Y. For example, the bit line 150 may be formed by forming a conductive layer (not shown) and subsequently performing a trimming process for reducing a first width W11 in a second horizontal direction Y and a width (not shown) in a first horizontal direction X on the conductive layer. Accordingly, the bit line 150 may have a relatively small area, and a distance D11 between two adjacent bit lines 150 may be relatively large.

A bit line insulating layer 152 extending in the vertical direction Z may be disposed around the bit line 150. A bottom portion of the bit line insulating layer 152 may contact an upper surface of the bottom spacer layer 132L.

The cell capacitor CAP may include the first electrode ELL the second electrode EL2, and the capacitor dielectric layer DL. The first electrode EL1 may have a cup shape connected to the second source/drain region 126 and extending in the first horizontal direction X. For example, as illustrated in FIG. 4, the first electrode EL1 may have a U-shaped horizontal cross-section rotated by 90 degrees.

The capacitor dielectric layer DL may conformally cover the surface of the first electrode ELL and the second electrode EL2 may be disposed on the capacitor dielectric layer DL to cover the first electrode ELL In some example embodiments, the first electrode EL1 and the second electrode EL2 may include a doped semi-conductor material, a conductive metal nitride such as titanium nitride, tantalum nitride, niobium nitride, or tungsten nitride, a metal such as tungsten, ruthenium, iridium, titanium or tantalum, and a conductive metal oxide such as iridium oxide or niobium oxide.

In general, as the degree of integration of DRAM devices increases, the difficulty of the process of forming a capacitor having an increased surface area significantly increases. To solve this and obtain a high memory capacity, a three-dimensional semiconductor memory device, in which a plurality of memory cells constituted by a cell transistor CTR and a cell capacitor CAP are vertically stacked, has been proposed. However, since the width of the bit line is determined by the size of the vertical through-hole formed in the manufacturing process of the three-dimensional struc-ture, parasitic capacitance may occur or increase due to bit lines having a relatively large size, and thus, there is a difficulty in optimizing or improving the electrical charac-teristics of semiconductor memory devices.

However, according to some example embodiments of the inventive concepts, the bit line 150 may be formed by forming a conductive layer in the space exposed through the vertical through-hole, and then further performing a trim-ming process to reduce the width of the conductive layer, and accordingly, the bit line 150 may have a reduced first width W11, and the distance D11 between two adjacent bit lines 150 may also be relatively large. Accordingly, parasitic capacitance caused by the bit line 150 may be reduced, and the semiconductor memory device 100 may have improved electrical characteristics.

Figure 6:
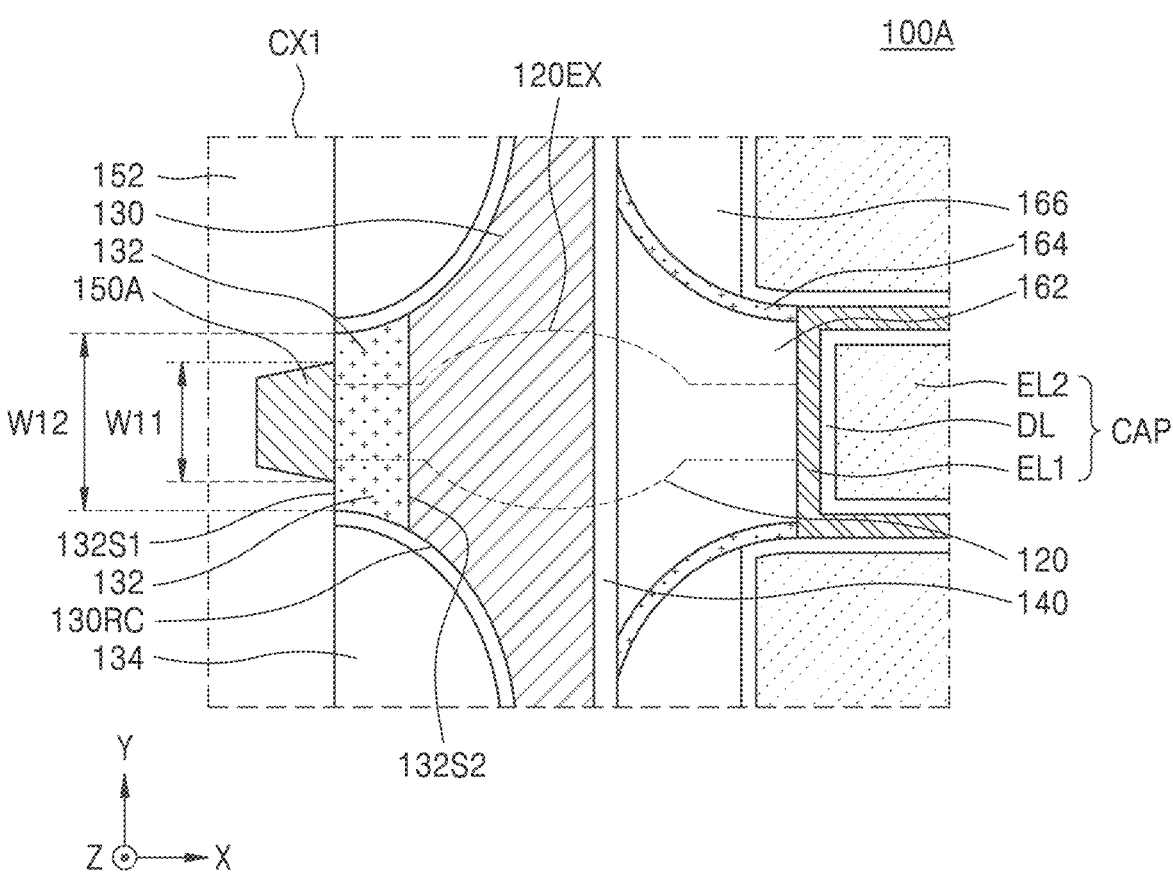
FIG. 6 is a plan view illustrating a semiconductor memory device according to an example embodiment.

FIG. 6 is a plan view illustrating a semiconductor memory device 100A according to some example embodiment. FIG. 6 is a plan view corresponding to an enlarged plan view of a portion CX1 of FIG. 3.

Referring to FIG. 6, in a bit line 150A, the first sidewall facing the first sidewall 132S1 of the spacer 132 has a first width W11 in the second horizontal direction Y, and the first width W11 may be less than the second width W12 of the spacer 132. In a plan view, the bit line 150A may have a trapezoidal shape in which the width of the bit line 150A in the second horizontal direction Y decreases in a direction away from the first sidewall 132S1 of the spacer 132.

For example, a conductive layer (not shown) is formed to form a bit line 150A; and thereafter, in the process of performing the trimming process on the conductive layer, a portion of the bit line 150A disposed farther from the spacer 132 may be exposed more to the etching atmosphere, and thus the bit line 150A may be formed to have a trapezoidal shape in a plan view.

Figure 7:
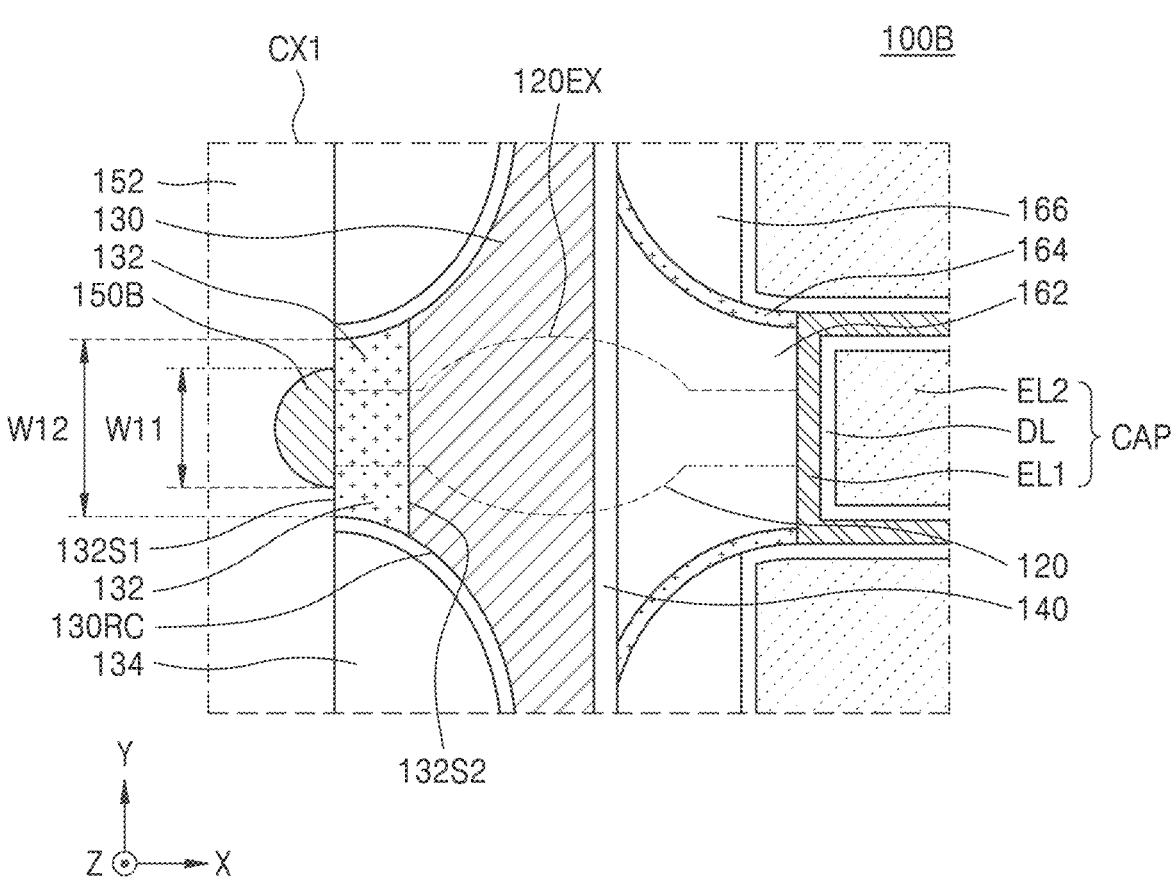
FIG. 7 is a plan view illustrating a semiconductor memory device according to an example embodiment.

FIG. 7 is a plan view illustrating a semiconductor memory device 100B according to some example embodiment. FIG. 7 is a plan view corresponding to an enlarged plan view of a portion CX1 of FIG. 3.

Referring to FIG. 7, in a bit line 150B, the first sidewall facing the first sidewall 132S1 of the spacer 132 has a first width W11 in the second horizontal direction Y, and the first width W11 may be less than the second width W12 of the spacer 132. A second sidewall of the bit line 150B may face a first sidewall facing the first sidewall 132S1 of the spacer 132, and may be a curved sidewall. In a plan view, the bit line 150B may have a semi-circular shape or a semi-elliptical shape in which the width of the bit line 150B in the second horizontal direction Y decreases in a direction away from the first sidewall 132S1 of the spacer 132.

For example, a conductive layer (not shown) is formed to form a bit line 150B; and thereafter, in the process of performing the trimming process on the conductive layer, a portion of the bit line 150B disposed farther from the spacer 132 may be exposed more to the etching atmosphere, and thus the bit line 150B may be formed to have a semicircular shape in a plan view.

Figure 8:
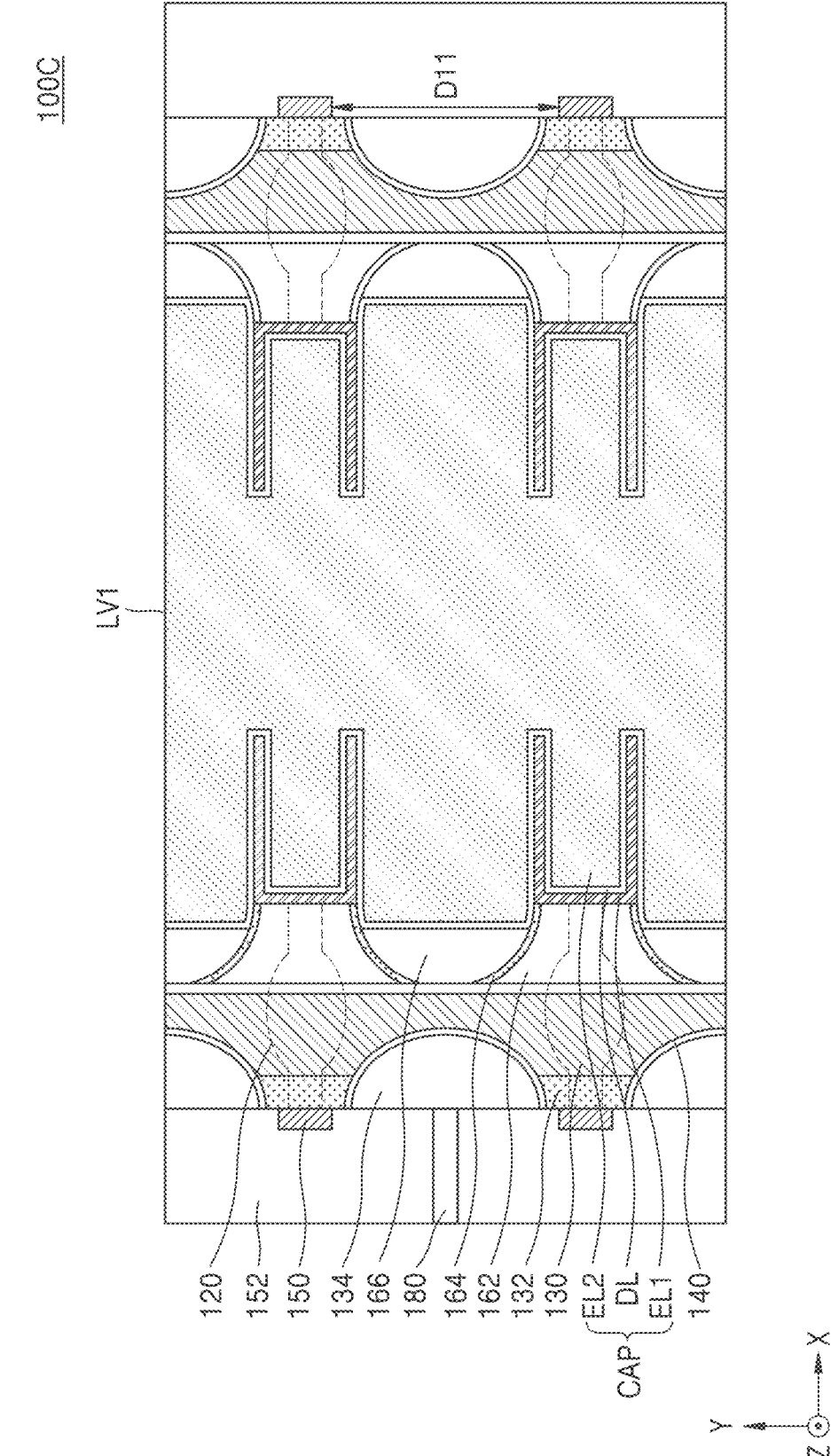
FIG. 8 is a plan view illustrating a semiconductor memory device according to an example embodiment.

FIG. 8 is a plan view illustrating a semiconductor memory device 100C according to some example embodiment.

Referring to FIG. 8, a shield layer 180 may extend in the vertical direction Z between two adjacent bit lines 150. The shield layer 180 may be surrounded by the bit line insulating layer 152. The shield layer 180 may include air or a low-k material. As the shield layer 180 is disposed between two adjacent bit lines 150, parasitic capacitance caused by the bit lines 150 may be reduced, and the semiconductor memory device 100C may have improved electrical characteristics.

Figure 9:
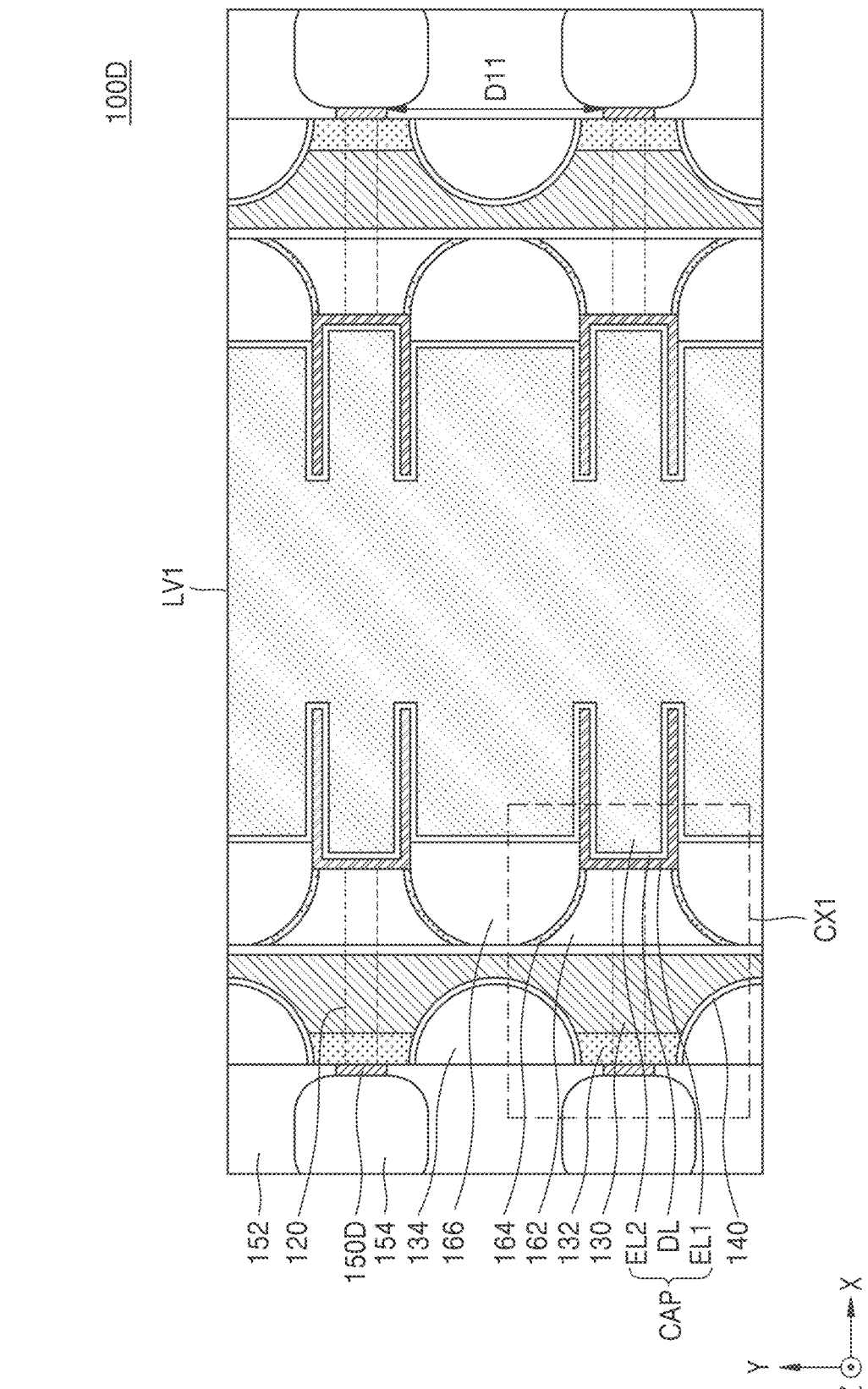
FIG. 9 is a plan view illustrating a semiconductor memory device according to an example embodiment.
Figure 10:
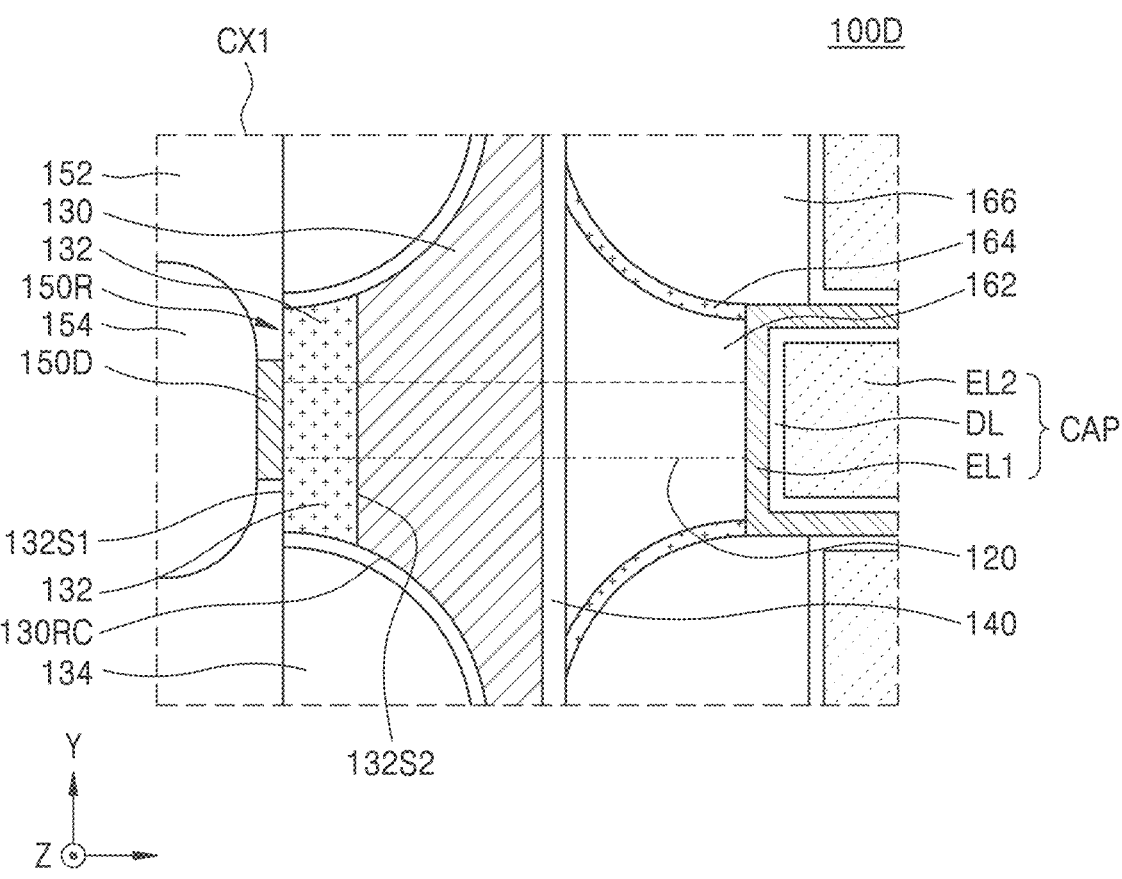
FIG. 10 is an enlarged view of a portion CX1 of FIG. 9.

FIG. 9 is a plan view illustrating a semiconductor memory device 100D according to some example embodiment. FIG. 10 is an enlarged view of a portion CX1 of FIG. 9.

Referring to FIGS. 9 and 10, a buried insulating layer 154 extending in the vertical direction Z may be disposed on one sidewall of a bit line 150D, and the bit line 150D may be disposed between the buried insulating layer 154 and the spacer 132. A width in the second horizontal direction Y of the buried insulating layer 154 may be greater than a width of the bit line 150D, and a width of the spacer 132 in the second horizontal direction Y may be greater than the width of the bit line 150D in the second horizontal direction. Accordingly, a recess region 150R may be defined in a space between the buried insulating layer 154, the spacer 132, and the bit line 150D. For example, the sidewall of the bit line 150D may be recessed in the second horizontal direction Y with respect to the sidewall of the buried insulating layer 154 and the sidewall of the spacer 132.

In some example embodiments, the recess region 150R may be a region formed by removing a sidewall portion of the bit line 150D formed in the space between the buried insulating layer 154 and the spacer 132 through a trimming process. A portion of the bit line insulating layer 152 may extend into the recess region 150R to fill the recess region 150R.

Figure 11:
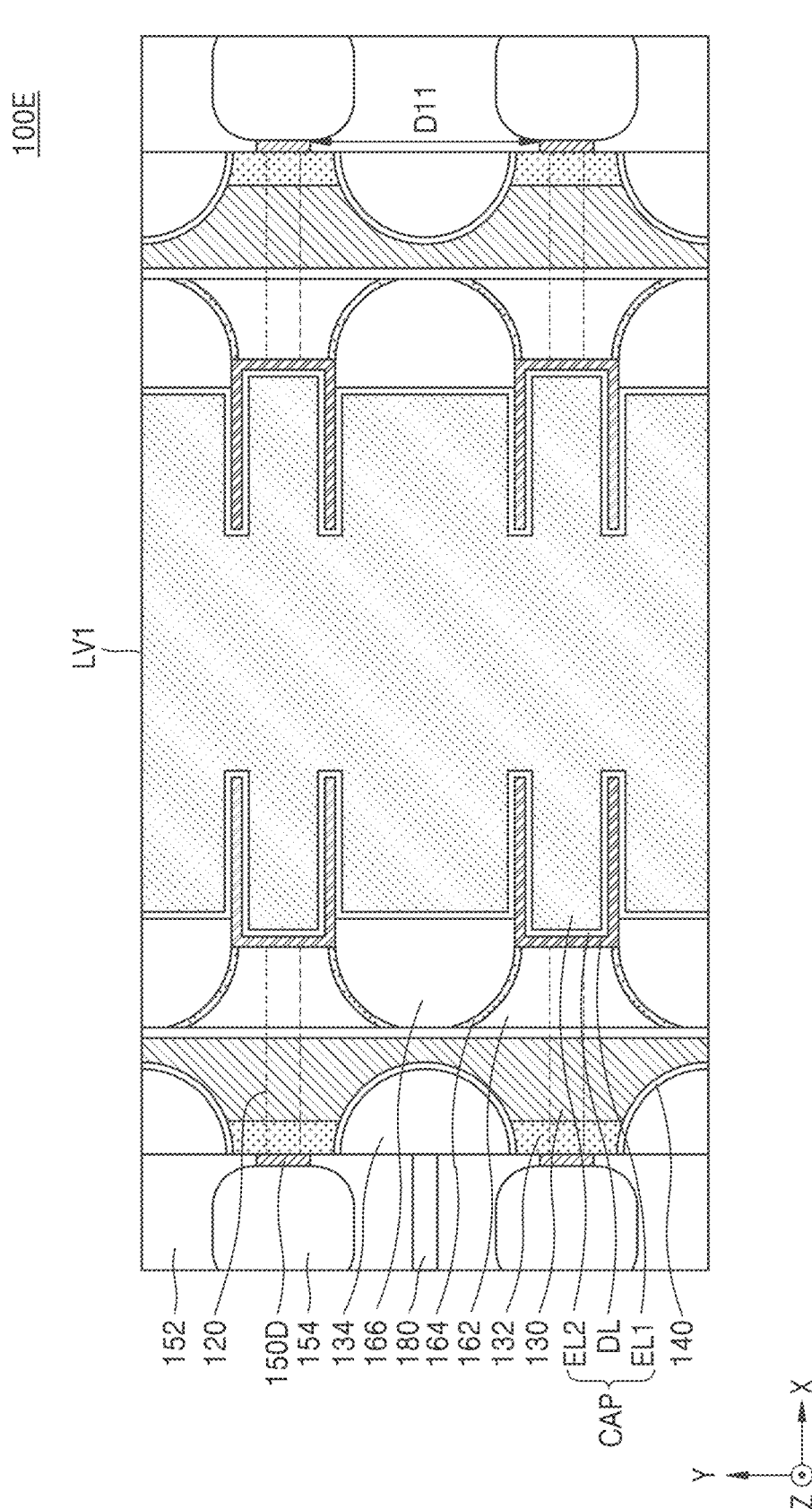
FIG. 11 is a plan view illustrating a semiconductor memory device according to an example embodiment.

FIG. 11 is a plan view illustrating a semiconductor memory device 100E according to an example embodiment.

Referring to FIG. 11, a buried insulating layer 154 extending in the vertical direction Z may be disposed on one sidewall of the bit line 150D, and the bit line 150D may be disposed between the buried insulating layer 154 and the spacer 132. A width in the second horizontal direction Y of the buried insulating layer 154 and a width in the second horizontal direction Y of the spacer 132 may be greater than a width of the bit line 150D, and a recess region 150R may be defined in a space between the buried insulating layer 154, the spacer 132, and the bit line 150D.

The shield layer 180 may extend in the vertical direction Z between two adjacent bit lines 150D and may be surrounded by the bit line insulating layer 152. The shield layer 180 may include air or a low-k material.

Figure 12A:
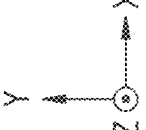

FIGS. 12A to 19 are schematic diagrams illustrating a method of manufacturing the semiconductor memory device 100, according to an example embodiment. FIGS. 12A, 13A, and 14A are plan views at the first vertical level LV1 of FIG. 2, FIG. 12B is a cross-sectional view taken along line B-B' of FIG. 12A, and FIG. 13B is a cross-sectional view taken along line C-C' of FIG. 13A. FIG. 14B is a cross-sectional view taken along line B-B' of FIG. 14A, and FIG. 14C is a cross-sectional view taken along line C-C' of FIG. 14A. FIGS. 15 to 19 are cross-sectional views corresponding to a cross-section taken along line B-B' of FIG. 14A.

Figure 12B:
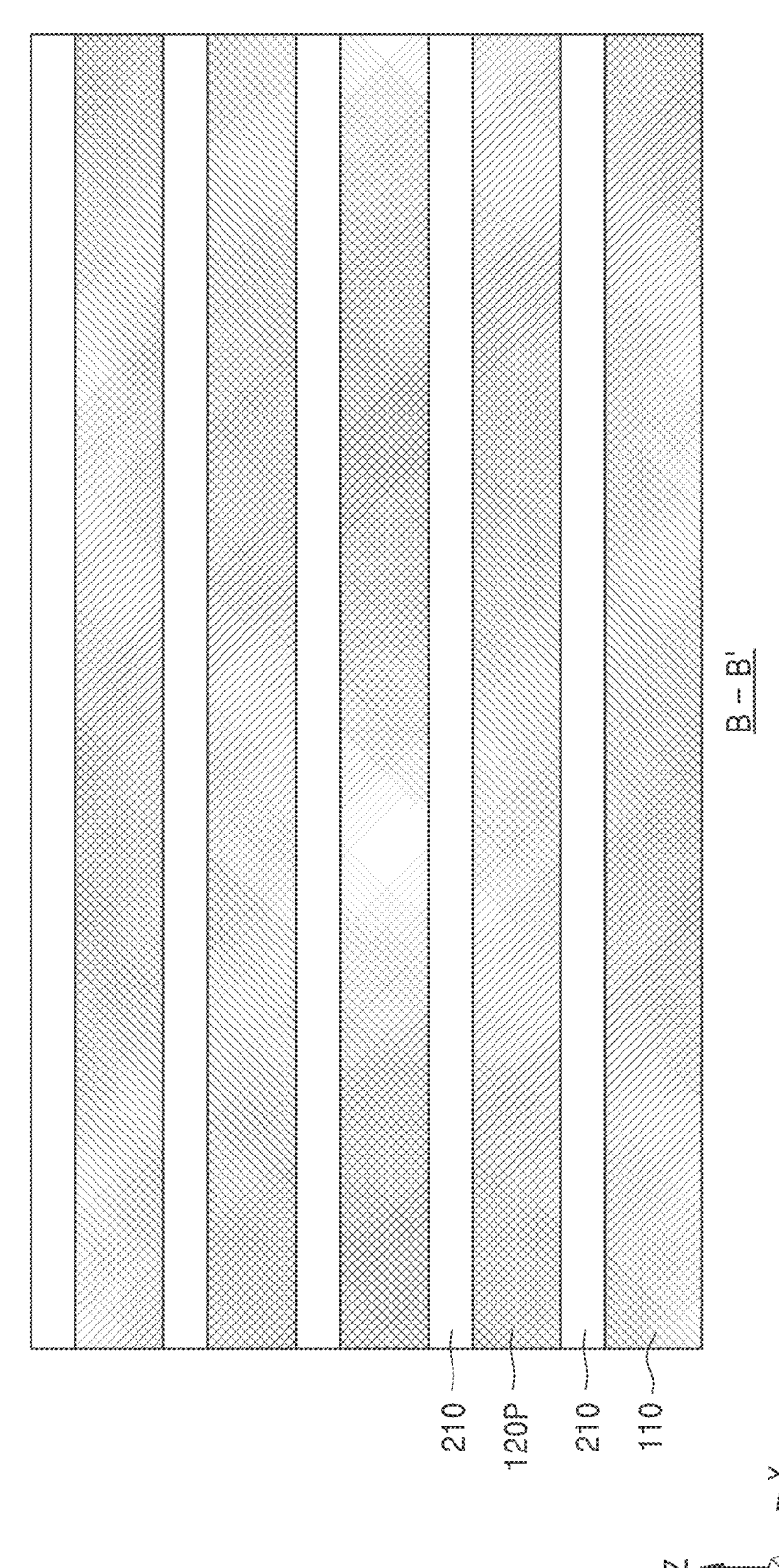
FIG. 12B is a cross-sectional view taken along line B-B' of FIG. 12A.

Referring to FIGS. 12A and 12B, a laminate structure MS, in which a plurality of sacrificial layers 210 and a plurality of single-crystal semiconductor layers 120P are alternately stacked with each other on a substrate 110, is formed.

The substrate 110 may include a single-crystal semiconductor material. For example, the substrate 110 may include a semiconductor material, such as Si or Ge. In some example embodiments, for example, the substrate 110 may include an SOI substrate or a GeOI substrate.

Each of the plurality of sacrificial layers 210 and the plurality of single-crystal semiconductor layers 120P may be formed of a single-crystal semiconductor material. The sacrificial layer 210 may be made of a semiconductor material having an etch selectivity with respect to the single-crystal semiconductor layer 120P. In some example embodiments, the sacrificial layer 210 may have an etch selectivity with respect to the substrate 110. In some example embodiments, the single-crystal semiconductor layer 120P may be made of a material having the same or substantially similar etching characteristics as that of the substrate 110, or may be made of the same material.

In some example embodiments, each of the plurality of sacrificial layers 210 may be made of SiGe, and each of the plurality of single-crystal semiconductor layers 120P may be made of Si. For example, each of the plurality of sacrificial layers 210 may be made of single-crystal SiGe, and each of the plurality of single-crystal semiconductor layers 120P may be made of single-crystal Si. In some other example embodiments, each of the plurality of single-crystal semiconductor layers 120P may include a single-crystal 2D semiconductor material or a single-crystal oxide semiconductor material. For example, the 2D semiconductor material may include $MoS_2$, $WSe_2$, graphene, carbon nanotube, or a combination thereof. For example, the oxide semiconductor material may include InxGayZnZO, InxGaySizO, InxSnyZnZO, InxZnyO, ZnxO, ZnxSnyO, ZnxOyN, ZrxZnySnzO, SnxO, HfxlnyZnzO, GaxZnySnzO, InxGayOxGaySnzO, YxGayO, or a combination thereof. For example, each of the plurality of single-crystal semiconductor layers 120P may include a single layer or layers of the oxide semiconductor material. In some example embodiments, each of the plurality of single-crystal semiconductor layers 120P may be formed of a material having a bandgap energy that is greater than that of silicon. For example, each of the plurality of single-crystal semiconductor layers 120P may be formed of a material having a bandgap energy of about 1.5 eV to about 5.6 eV. For example, each of the plurality of single-crystal semiconductor layers 120P may be formed of a material having desired channel performance when the band gap energy is about 2.0 eV to about 4.0 eV.

The plurality of sacrificial layers 210 and the plurality of single-crystal semiconductor layers 120P may be formed by a chemical vapor deposition (CVD) process, plasma-enhanced CVD (PECVD) process, or atomic layer deposition (ALD) process. In some example embodiments, each of the plurality of sacrificial layers 210 and the plurality of single-crystal semiconductor layers 120P may be formed in a single-crystal state by using a layer in contact therewith as a seed layer, or may be formed in a single-crystal state through a heat treatment process. Each of the plurality of sacrificial layers 210 and the plurality of single-crystal semiconductor layers 120P may have a thickness of several tens of nanometers (nm).

Figure 13A:
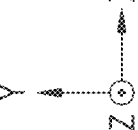
Figure 13B:
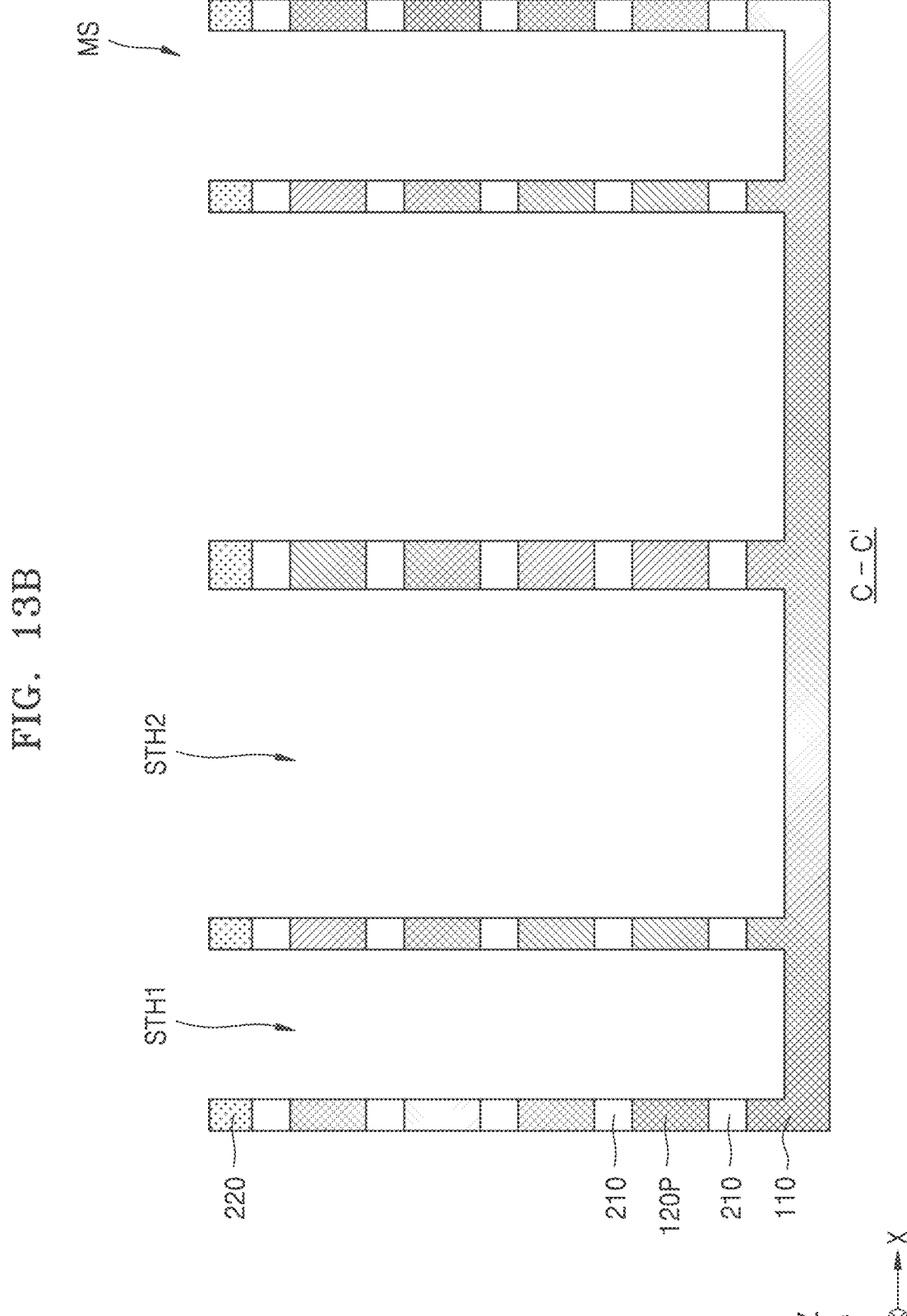
FIG. 13B is a cross-sectional view taken along line C-C' of FIG. 13A.

Referring to FIGS. 13A and 13B, after forming the first mask layer 220 on the laminate structure MS, by using the first mask layer 220 as an etch mask, a plurality of first through-holes STH1 and a plurality of second through-holes STH2 through the laminate structure MS to expose the substrate 110 are formed. The first mask layer 220 may have a plurality of openings corresponding to the plurality of first through-holes STH1 and the plurality of second through-holes STH2. In some example embodiments, the first mask layer 220 may be formed of silicon nitride.

The plurality of second through-holes STH2 may have a planar shape of an ellipse having a long axis in the first horizontal direction (X direction) and a minor axis (or alternatively, a short axis) in the second horizontal direction (Y direction), or a rectangular planar shape having a long axis in the first horizontal direction (X direction) and a minor axis in the second horizontal direction (Y direction) but with round corners. In some example embodiments, the plurality of first through-holes STH1 may have a planar shape of a circle, or a square with round corners.

The first through-hole STH1 and the second through-hole STH2 may be apart from each other in the first horizontal direction (X direction). In some example embodiments, one of the plurality of first through-holes STH1 and one of the plurality of second through-holes STH2 may be apart from each other on both sides in the first horizontal direction (X direction) of another of the plurality of second through-holes STH2.

Figure 14A:
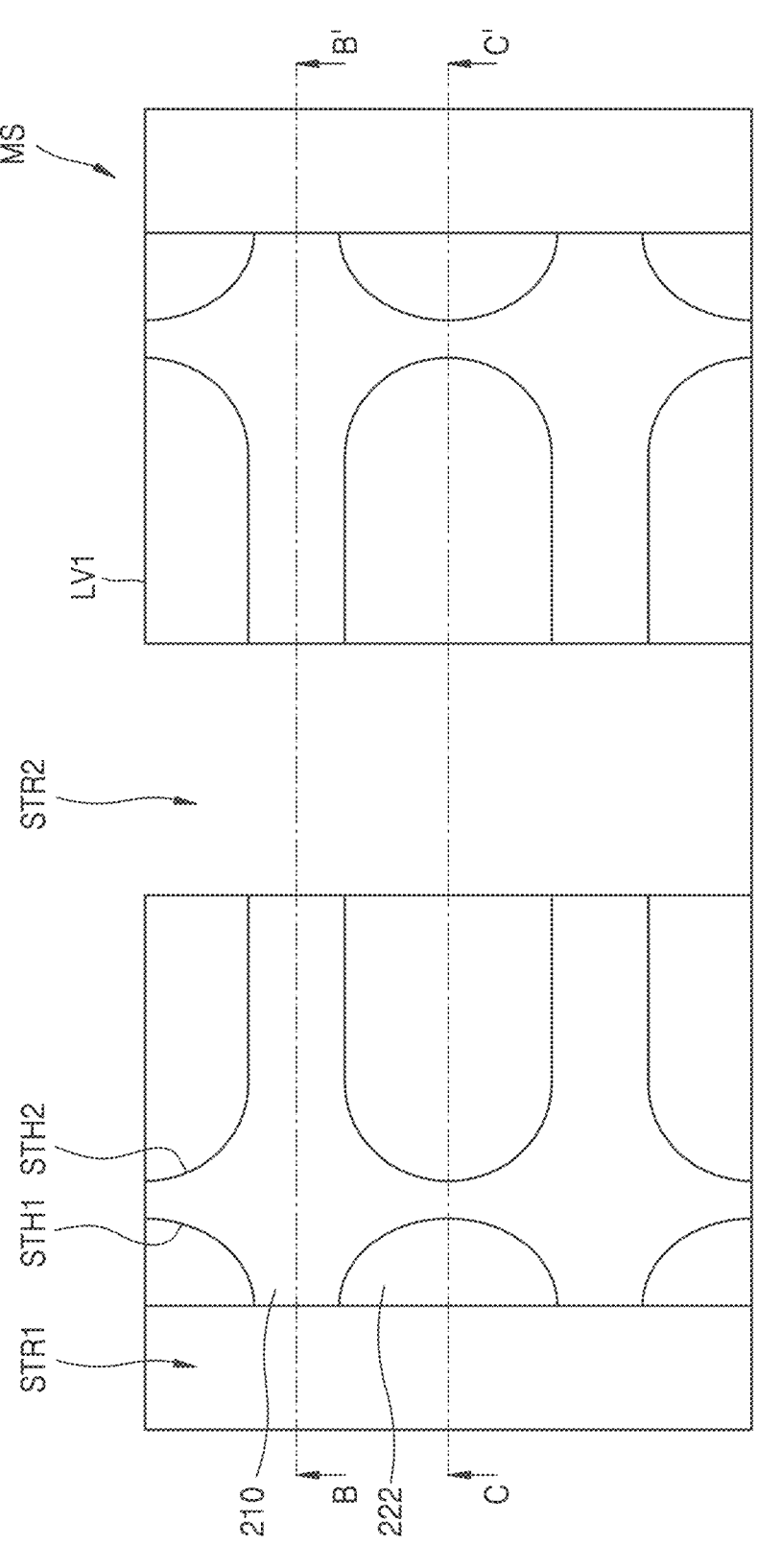
Figure 14B:
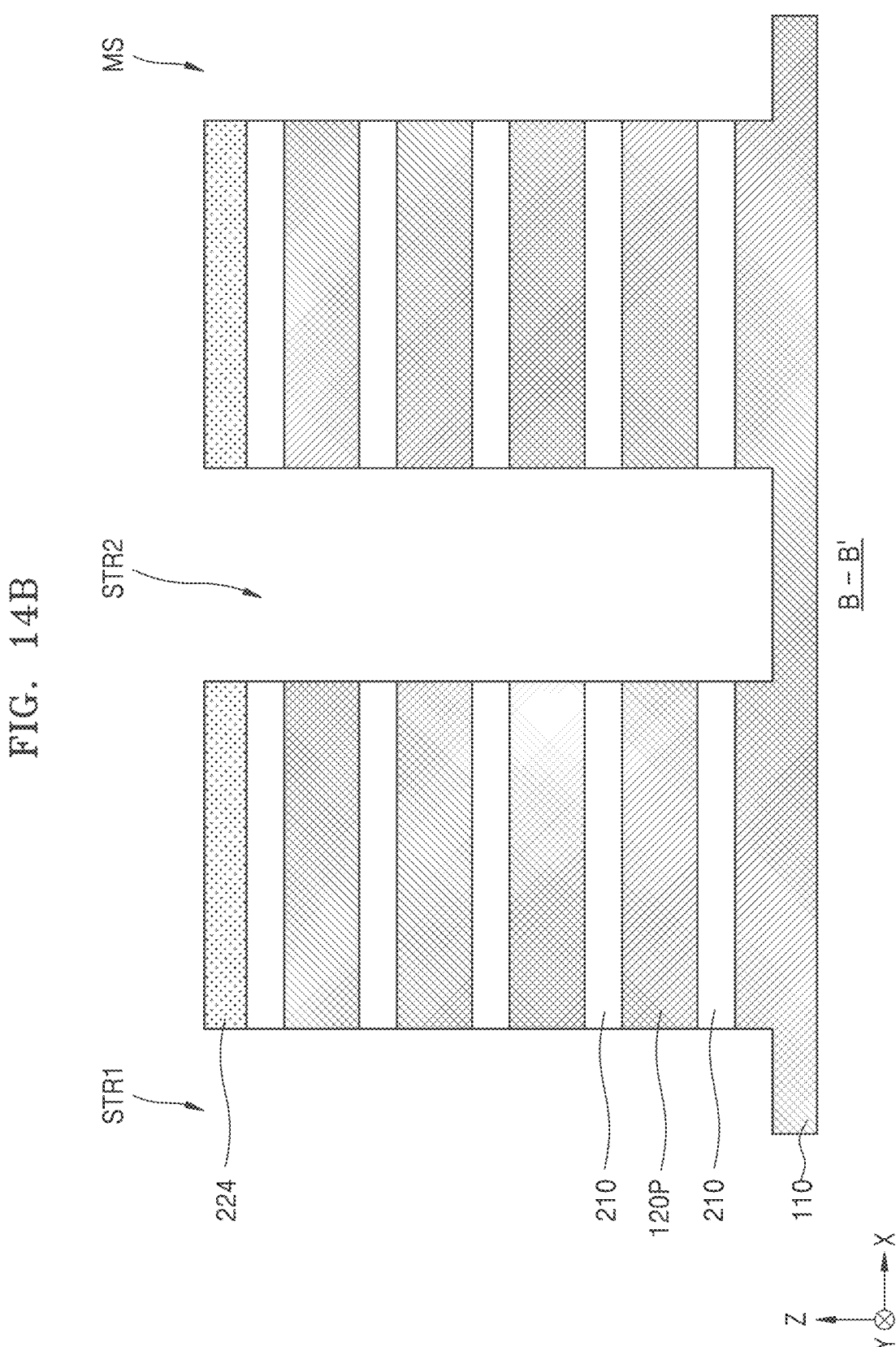
FIG. 14B is a cross-sectional view taken along line B-B' of FIG. 14A.
Figure 14C:
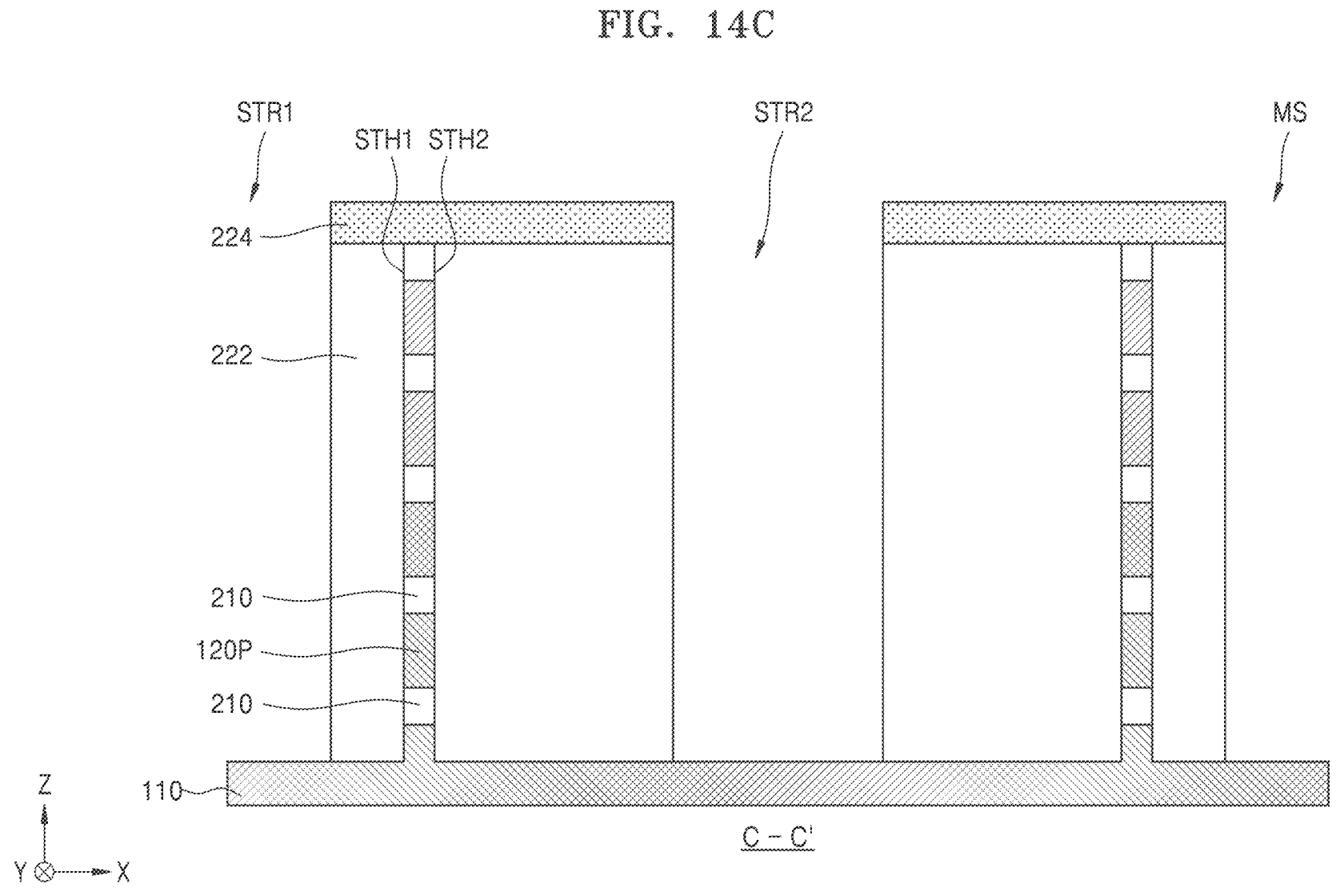

Referring to FIGS. 14A and 14B together, a first buried insulating layer 222 filling the plurality of first through-holes STH1 and the plurality of second through-holes STH2 is formed. In some example embodiments, the first buried insulating layer 222 may include any one of a silicon oxide film, a silicon oxynitride film, a carbon-containing silicon oxide film, a carbon-containing silicon nitride film, and a carbon-containing silicon oxynitride film.

After forming the second mask layer 224 covering the upper portions of the laminate structure MS and the first buried insulating layer 222, by using the second mask layer 224 as an etch mask, a first recess STR1 and a second recess STR2 exposing the substrate 110 are formed through the laminate structure MS and the first buried insulating layer 222. The second mask layer 224 may have a plurality of openings respectively corresponding to the first recess STR1 and the second recess STR2. In some example embodiments, the second mask layer 224 may be formed of silicon nitride.

Each of the first recess STR1 and the second recess STR2 may have a shape extending in the second horizontal direction (Y direction). The first recess STR1 may vertically overlap a portion of the plurality of first through-holes STH1, and a portion of the first buried insulating layer 222 filling the plurality of first through-holes STH1 may be exposed on the inner surface of the first recess STR1.

The second recess STR2 may vertically overlap a portion of the plurality of second through-holes STH2, and a portion of the first buried insulating layer 222 filling the plurality of second through-holes STH2 may be exposed on the inner surface of the second recess STR2.

Figure 15:
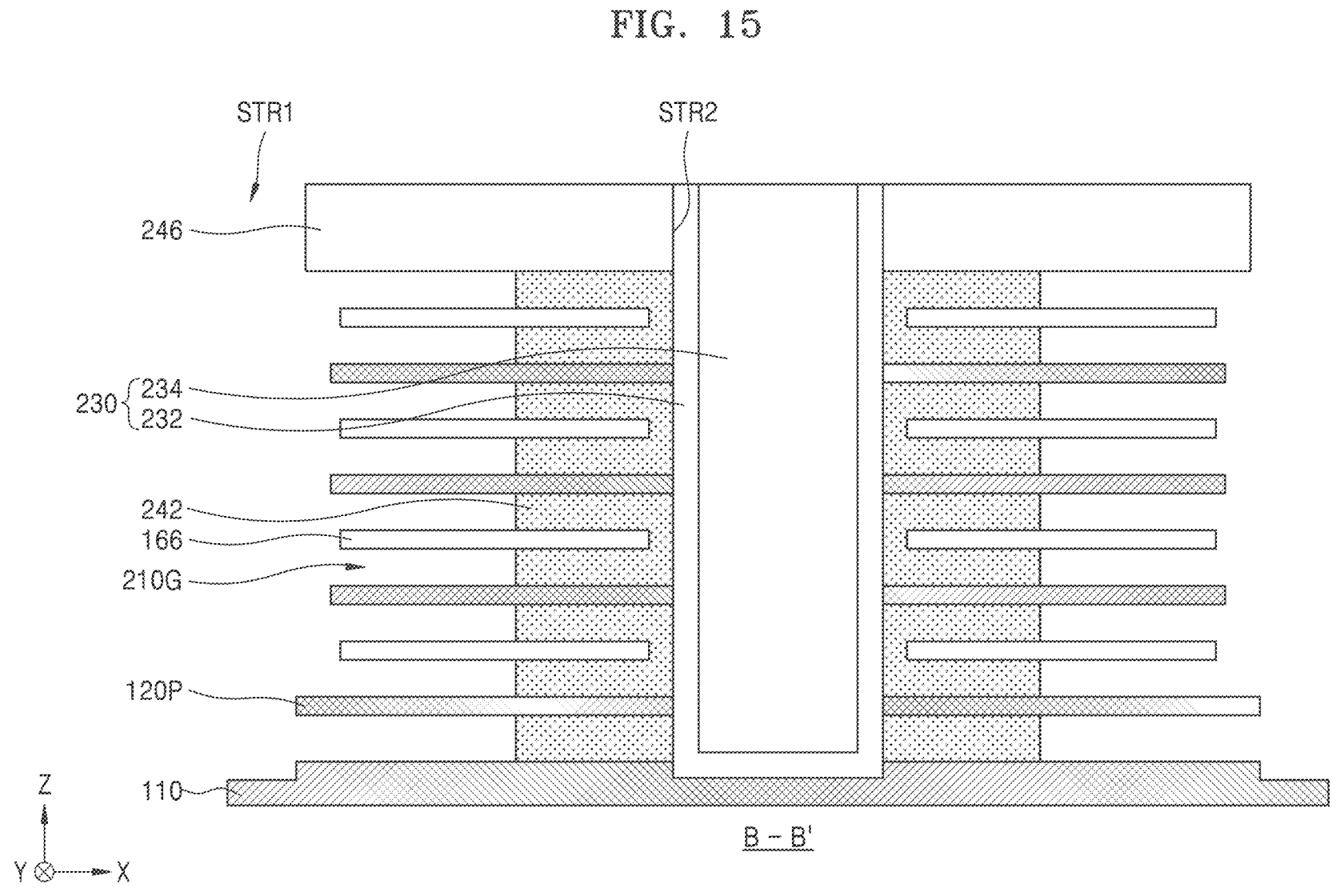

Referring to FIG. 15, after the buried structure 230 filling the first recess STR1 is formed, the second mask layer 224 is removed, and the first buried insulating layer 222 filling the plurality of first through-holes STH1 and the plurality of second through-holes STH2 is removed.

In some example embodiments, the buried structure 230 may include a liner layer 232 and a buried layer 234. The liner layer 232 may conformally cover a bottom surface and a side surface of the second recess STR2. The buried layer 234 may cover the liner layer 232 and fill the second recess STR2. In some example embodiments, the liner layer 232 may be made of silicon nitride. In some example embodiments, the buried layer 234 may include any one of a silicon oxide film, a silicon oxynitride film, a carbon-containing silicon oxide film, a carbon-containing silicon nitride film, or a carbon-containing silicon oxynitride film.

Thereafter, the plurality of sacrificial layers 210 are removed through the plurality of first through-holes STH1, such that a plurality of first gaps 210G are formed between the plurality of single-crystal semiconductor layers 120P. The plurality of first gaps 210G may be formed by removing the plurality of sacrificial layers 210 through an isotropic etching process having an etch selectivity with respect to the substrate 110, the plurality of single-crystal semiconductor layers 120P, and the liner layer 232.

In some example embodiments, a portion of the plurality of single-crystal semiconductor layers 120P is removed through an isotropic etching process having an etching selectivity with respect to the liner layer 232 such that an isotropic etching process for expanding the plurality of first gaps 210G may be further performed, and accordingly, the horizontal width and vertical thickness of the plurality of single-crystal semiconductor layers 120P may be further reduced.

Thereafter, the plurality of supporting insulating layers 242 covering the surfaces of the plurality of single-crystal semiconductor layers 120P and the separation insulating layer 166 covering the surfaces of the supporting insulating layers 242 are formed. The separation insulating layer 166 may be formed to cover the surfaces of the plurality of supporting insulating layers 242 and form an integral body. The plurality of supporting insulating layers 242 and the separation insulating layer 166 may be formed to completely fill the plurality of first gaps 210G.

An upper insulating layer 246 may be formed on the uppermost supporting insulating layer 242. The upper insulating layer 246 includes silicon oxide and may be disposed on the same level as the upper surface of the buried structure 230.

After that, by removing a part of the supporting insulating layer 242, a width of the supporting insulating layer 242 in the first horizontal direction X may be formed to be less than a width of the plurality of single-crystal semiconductor layers 120P. Accordingly, the plurality of first gaps 210G may be exposed again. In some example embodiments, the process of removing a portion of the supporting insulating layer 242 may be performed by a pull back process using an etchant including phosphoric acid, but example embodiments are not limited thereto.

As part of the supporting insulating layer 242 is removed, a portion of the separation insulating layer 166 and a portion of the plurality of single-crystal semiconductor layers 120P may be disposed to protrude outward from the supporting insulating layer 242.

Figure 16:
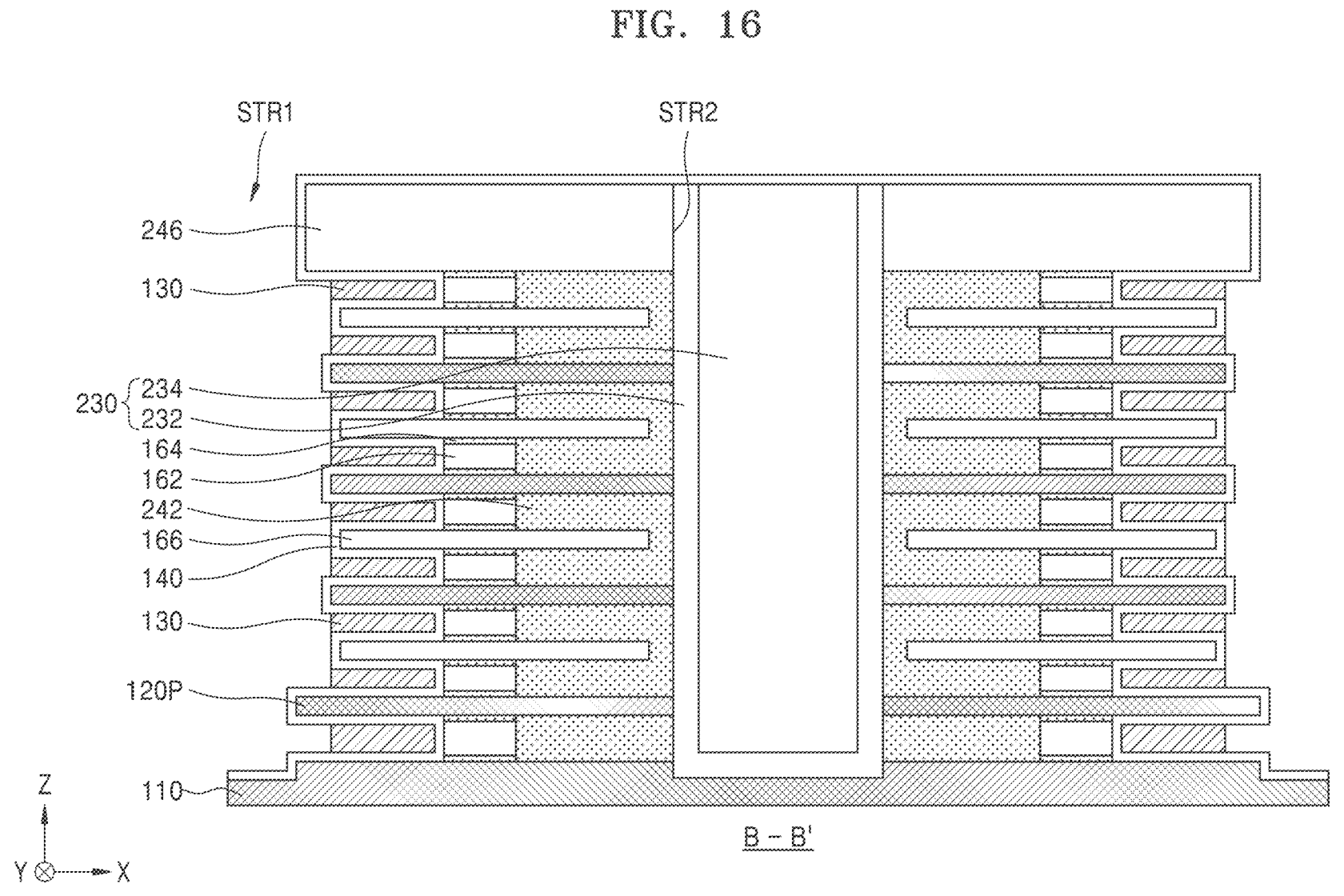

Referring to FIG. 16, after forming a layer of a spacer liner material on the exposed surface of FIG. 15 and forming a layer of a spacer buried material covering the layer of a spacer liner material, by removing a portion of the spacer liner material layer and the spacer buried material layer, a spacer liner layer 164 covering an inner surface of a portion of the space between the plurality of single-crystal semiconductor layers 120P and the plurality of separation insulating layers 244 adjacent in the vertical direction (Z direction) and a spacer buried layer filling a portion of the spacer buried layer 162 are formed. In some example embodiments, the spacer liner layer 164 may be formed of silicon nitride, and the spacer buried layer 162 may include any one of a silicon oxide film, a silicon oxynitride film, a carbon-containing silicon oxide film, a carbon-containing silicon nitride film, and a carbon-containing silicon oxynitride film.

After the spacer liner layer 164 and the spacer buried layer 162 are formed, the gate insulating layer 140 and the word line 130 covering the exposed surface are formed. After forming the gate electrode material layer covering the gate insulating layer 140 and filling the first recess STR1, by removing a portion of the gate electrode material layer, the word line 130 may be formed such that the remainder of the gate electrode material layer remains only in an inner portion of the remainder of the space between the plurality of single-crystal semiconductor layers 120P and the separation insulating layer 166.

The gate insulating layer 140 may be formed of at least one selected from silicon oxide, a ferroelectric material, and a high-k dielectric material having a dielectric constant higher than that of silicon oxide. In some example embodiments, the gate insulating layer 140 may have a laminate structure of a first dielectric layer made of silicon oxide and a second dielectric layer made of at least one selected from a high-k dielectric material and a ferroelectric material. For example, high-k dielectric materials and ferroelectric materials may include at least one selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxide nitride (ZrON), zirconium silicon oxynitride (Zr- SiON), tantalum oxide (TaO), titanium oxide (TiO), barium strontium titanium oxide (BaSrTiO), barium titanium oxide (BaTiO), lead zirconate titanate (PZT), strontium bismuth tantalate (STB), bismuth iron oxide (BFO), strontium titanium oxide (SrTiO), yttrium oxide (YO), aluminum oxide (AlO), and lead scandium tantalum oxide (PbScTaO).

In some example embodiments, the word line 130 may include a conductive barrier film covering the gate insulating layer 140 and a conductive filling layer covering the conductive barrier film. The conductive barrier film may include, for example, a metal, a conductive metal nitride, a conductive metal silicide, or a combination thereof. For example, the conductive barrier film may be made of TiN. The conductive filling layer may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof. In some example embodiments, the conductive filling layer may include W.

Figure 17:
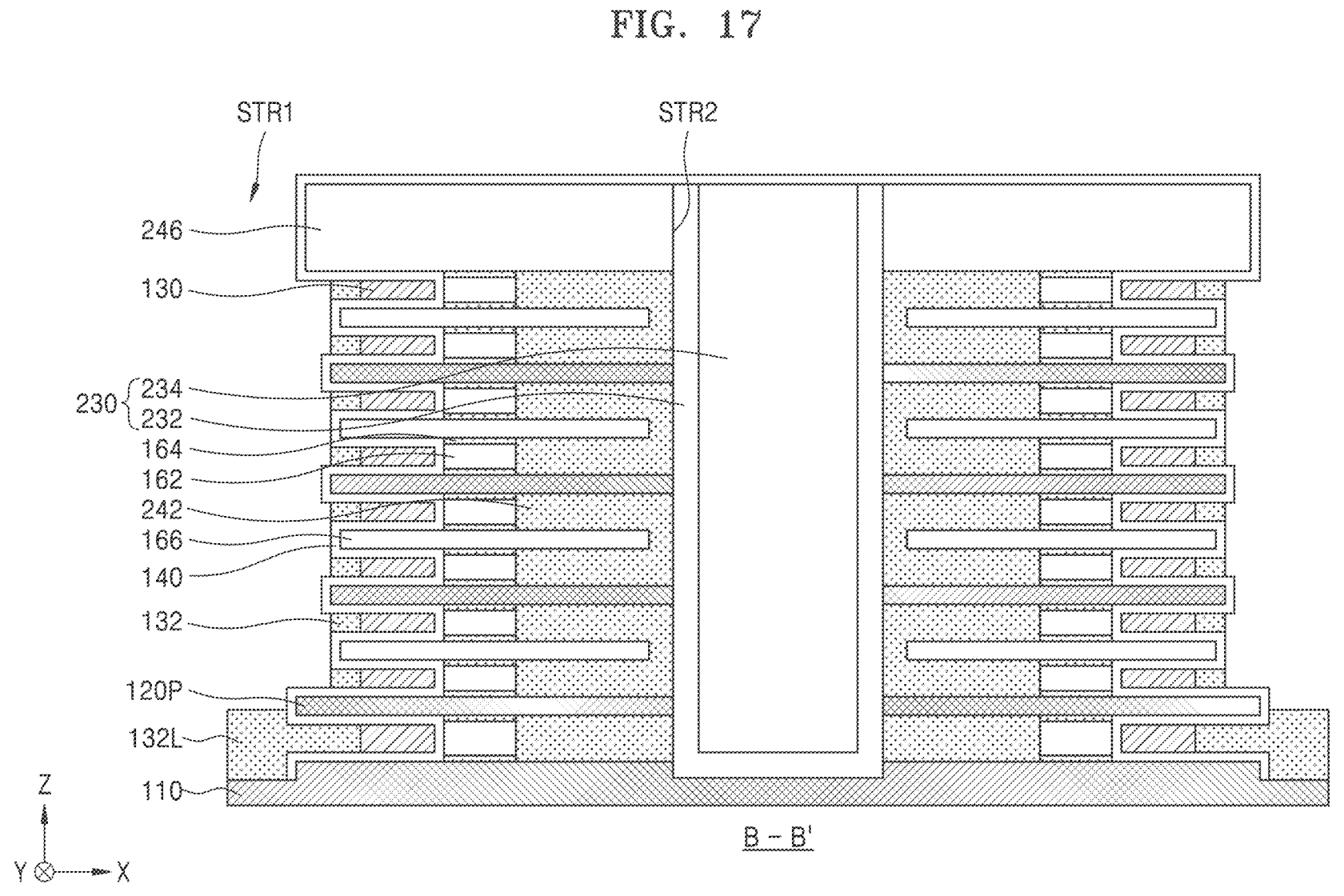

Referring to FIG. 17, a plurality of spacers 132 filling a space between the plurality of single-crystal semiconductor layers 120P and the separation insulating layer 166 in the vertical direction Z may be formed. In some example embodiments, each of the plurality of spacers 132 may be formed of silicon nitride. In some example embodiments, some of the plurality of spacers 132 may cover the surface of the substrate 110 exposed on the bottom surface of the first recess STR1. In addition, a portion of the plurality of spacers 132 disposed on the substrate 110 is referred to as a bottom spacer layer 132L and may have a relatively large thickness.

Figure 18:
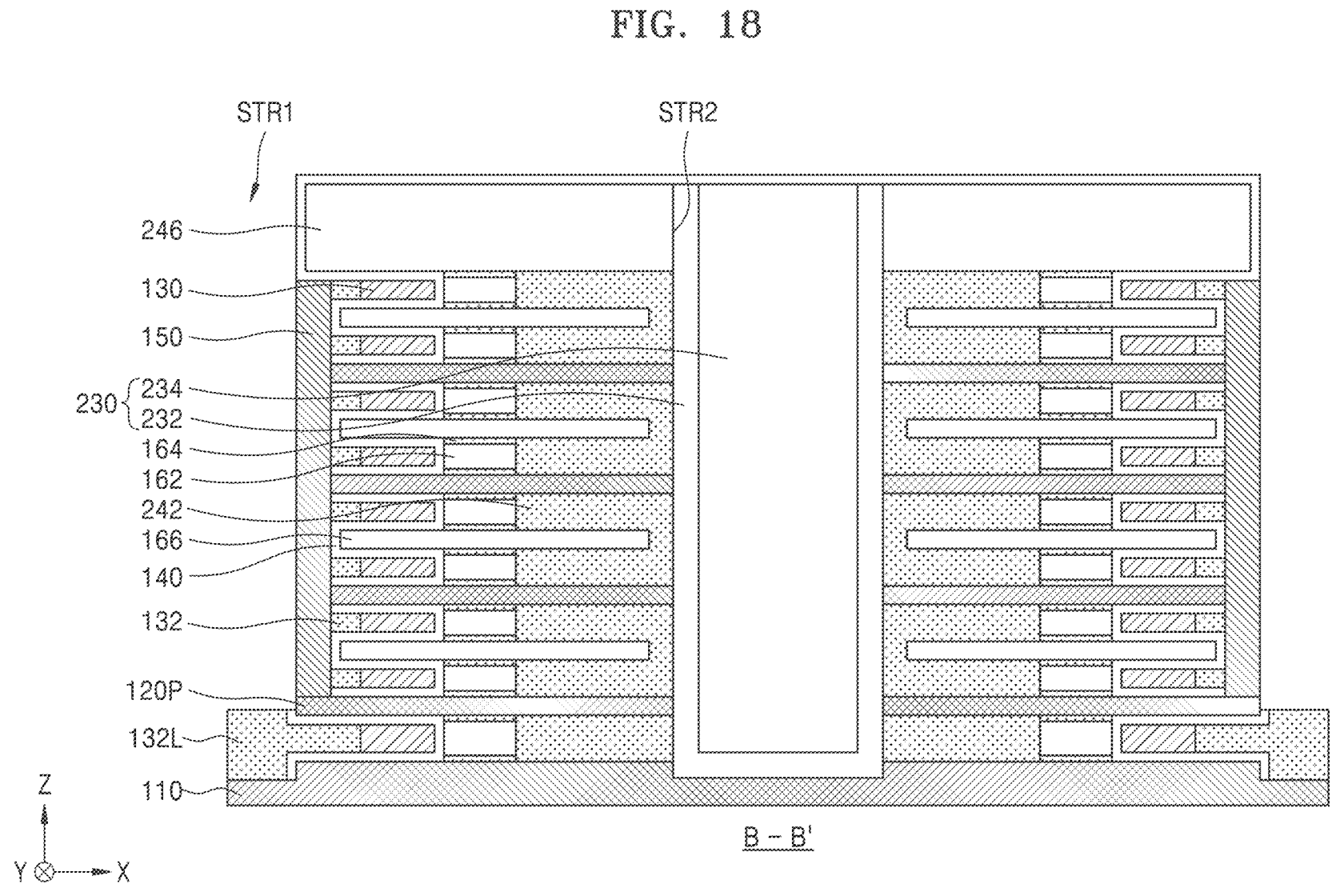

Referring to FIG. 18, a portion of the plurality of single-crystal semiconductor layers 120P exposed in the first recess STR1 and a portion of the gate insulating layer 140 covering the plurality of single-crystal semiconductor layers 120P are removed. One end of the plurality of single-crystal semiconductor layers 120P facing the first recess STR1 may be exposed.

In some example embodiments, impurities may be implanted into one end of the plurality of single-crystal semiconductor layers 120P exposed through the first recess STR1 to form a plurality of first source/drain regions 122.

Thereafter, a plurality of bit lines 150 contacting the plurality of first source/drain regions 122 and extending in the vertical direction in the plurality of first through-holes STH1 are formed. Each of the plurality of bit lines 150 may be any one of doped semiconductor materials such as silicon doped with impurities, germanium doped with impurities, a conductive metal nitride such as titanium nitride and tantalum nitride, a metal such as tungsten, titanium, and tantalum, and a metal-semiconductor compound such as tungsten silicide, cobalt silicide, and titanium silicide.

In some example embodiments, each of the plurality of bit lines 150 may include a conductive barrier film in contact with the first source/drain region 122 and a conductive filling layer covering the conductive barrier film. The conductive barrier film may include, for example, a metal, a conductive metal nitride, a conductive metal silicide, or a combination thereof. For example, the conductive barrier film may be made of TiN. The conductive filling layer may include, for example, doped silicon, Ru, RuO, Pt, PtO, Ir, IrO, SRO(SrRuO), BSRO((Ba,Sr)RuO), CRO(CaRuO), BaRuO, La(Sr,Co)O, Ti, TiN, W, WN, Ta, TaN, TiAlN, TiSiN, TaAlN, TaSiN, or a combination thereof. In some example embodiments, the conductive filling layer may include W.

Figure 19:
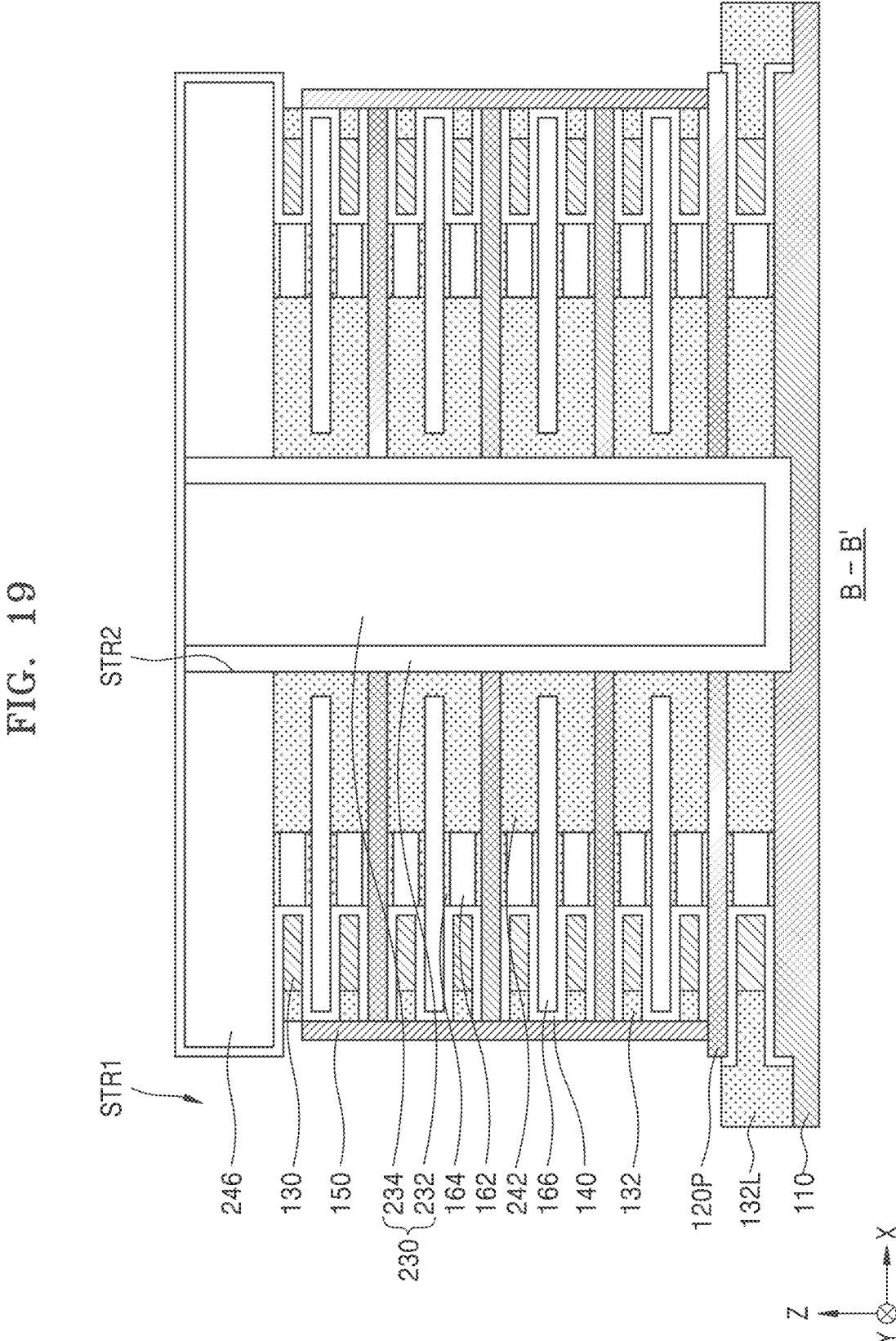

Referring to FIG. 19, a trimming process is performed on the plurality of bit lines 150 such that the width W11 (see FIG. 5) of the plurality of bit lines 150 in the first horizontal direction X and in the second horizontal direction Y may be reduced. In the trimming process, upper portions of the plurality of bit lines 150 may also be removed to lower the height of the plurality of bit lines 150. Also, as the width of the bit line 150 decreases, the distance D11 (see FIG. 3) between two adjacent bit lines 150 may also increase.

In the trimming process, the sidewall portion of the bit line 150 disposed farther from the spacer 132 may be exposed more to the etching atmosphere, and thus, the semiconductor memory devices 100A and 100B described with reference to FIGS. 6 and 7 may be formed.

Referring back to FIG. 3, the bit line insulating layer 152 filling the first recess STR1 is formed, and the buried structure 230 filling the second recess STR2 is removed. In some example embodiments, the bit line insulating layer 152 may be made of silicon oxide. After removing the buried structure 230 filling the second recess STR2, a plurality of supporting insulating layers 242 are removed through the second recess STR2 to form a removal space (not shown) communicating with the second recess STR2.

For example, after conformally forming the first electrode EL1 in a part of the removal space defined by the plurality of separation insulating layers 166, a portion of the other end facing the second recess STR2 among both ends in the first horizontal direction (X direction) of each of the plurality of separation insulating layers 166 is removed, such that the extension length of the plurality of separation insulating layers 166 protruding from the spacer liner layer 164 and the spacer buried layer 162 in the first horizontal direction (X direction) toward the second recess STR2 may be shorter than the extension length of the plurality of single-crystal semiconductor layers 120P.

Thereafter, the capacitor dielectric layer DL may be conformally formed on the first electrode EL1 in the removal space, and then the second electrode EL2 may be formed on the capacitor dielectric layer DL to fill the removal space.

The semiconductor memory device 100 may be formed using the process described above.

According to some example embodiments, in relation to the semiconductor memory device 100, after forming the bit line 150, a trimming process may be performed on the bit line 150. Accordingly, parasitic capacitance caused by the bit line 150 may be reduced, and thus improved operating characteristics may be obtained.

While the inventive concepts have been particularly shown and described with reference to some example embodiments thereof, it will be understood that various changes in form and details may be made therein without departing from the spirit and scope of the following claims.

What is claimed is:

1. A semiconductor memory device comprising:
    a transistor body extending in a first horizontal direction on a substrate, the transistor body including a first source/drain region, a single-crystal channel layer, and a second source/drain region sequentially arranged in the first horizontal direction;
    a gate electrode layer extending in a second horizontal direction orthogonal to the first horizontal direction, the gate electrode layer covering upper and lower surfaces of the single-crystal channel layer;
    a bit line connected to the first source/drain region and extending in a vertical direction, the bit line having a first width in the second horizontal direction;

a spacer covering upper and lower surfaces of the first source/drain region and having a second width that is greater than the first width in the second horizontal direction, wherein the spacer is positioned between the gate electrode layer and the bit line in the first horizontal direction; and a cell capacitor on a side opposite to the bit line with respect to the transistor body in the first horizontal direction, the cell capacitor including a lower electrode layer connected to the second source/drain region, a capacitor dielectric layer, and an upper electrode layer, wherein the transistor body has a protrusion having a planar shape protruding convexly in the second horizontal direction, and a part of the protrusion is a part of the single-crystal channel layer.

2. The semiconductor memory device of claim 1, wherein a remainder of the protrusion is a part of the second source/drain region.

3. The semiconductor memory device of claim 1, wherein the spacer vertically overlaps the first source/drain region and is in contact with the bit line.

4. The semiconductor memory device of claim 1, wherein each of the first source/drain region, the single-crystal channel layer, and the second source/drain region includes a single-crystal semiconductor material.

5. The semiconductor memory device of claim 1, wherein the single-crystal channel layer includes a single-crystal semiconductor material, and each of the first source/drain region and the second source/drain region includes a polycrystalline semiconductor material doped with impurities.

6. The semiconductor memory device of claim 1, wherein the bit line has a trapezoidal horizontal cross-sectional shape.

7. The semiconductor memory device of claim 6, wherein the spacer has a first sidewall in contact with the bit line and a second sidewall opposite the first sidewall, and a width of the bit line in the second horizontal direction decreases in a direction away from the first sidewall of the spacer.

8. The semiconductor memory device of claim 1, wherein the bit line has a horizontal cross-section in a shape of a semicircle, the spacer has a first sidewall in contact with the bit line and a second sidewall opposite the first sidewall, and wherein a width of the bit line in the second horizontal direction decreases in a direction away from the first sidewall of the spacer.

9. The semiconductor memory device of claim 1, wherein the spacer has a first sidewall in contact with the bit line and a second sidewall opposite the first sidewall, the semiconductor memory device comprising:

a buried insulating layer extending in the vertical direction, wherein the bit line is positioned between the first sidewall of the spacer and the buried insulating layer.

10. The semiconductor memory device of claim 9, wherein a width of the buried insulating layer in the second horizontal direction is greater than the first width of the bit line, and a sidewall of the bit line is recessed in the second horizontal direction with respect to a sidewall of the buried insulating layer and a sidewall of the spacer.

11. A semiconductor memory device comprising:

a plurality of transistor bodies spaced apart from each other in a vertical direction on a substrate and extending parallel to each other in a first horizontal direction, each of the plurality of transistor bodies including a first source/drain region, a single-crystal channel layer, and a second source/drain region sequentially arranged in the first horizontal direction, each of the plurality of transistor bodies having a protrusion convexly protruding in a second horizontal direction orthogonal to the first horizontal direction;

a plurality of bit lines spaced apart from each other in the second horizontal direction on the substrate, extending parallel to each other in the vertical direction, and each of the plurality of bit lines connected to the first source/drain region of a corresponding one of the plurality of transistor bodies;

a plurality of word lines spaced apart from each other in the vertical direction, extending parallel to each other in the second horizontal direction, the plurality of word lines having a gate insulating layer therebetween, and each of the plurality of word lines covering at least upper and lower surfaces of the single-crystal channel layer of a corresponding one of the plurality of transistor bodies;

a plurality of spacers each being on an upper surface and a lower surface of a corresponding one of the first source/drain region, and each of the plurality of spacers including a first sidewall in contact with a corresponding one of the plurality of bit lines; and a plurality of cell capacitors each connected to the second source/drain region of a corresponding one of the plurality of transistor bodies, each of the plurality of cell capacitors including a first electrode, a capacitor dielectric layer, and a second electrode, wherein each of the plurality of bit lines has a first width in the second horizontal direction, and each of the plurality of spacers has a second width in the second horizontal direction that is greater than the first width of each of the plurality of the bit lines.

12. The semiconductor memory device of claim 11, wherein a part of the protrusion is a part of the single-crystal channel layer, and the other part of the protrusion is a part of the second source/drain region.

13. The semiconductor memory device of claim 11, wherein the first electrode has a U-shaped vertical cross-section in which an open portion is rotated by 90 degrees toward a direction opposite to the second source/drain region.

14. The semiconductor memory device of claim 11, wherein each of the plurality of bit lines has a trapezoidal horizontal cross-sectional shape, and a width of each of the plurality of bit lines in the second horizontal direction decreases in a direction away from the first sidewall of a corresponding one of the plurality of spacers.

15. The semiconductor memory device of claim 11, wherein each of the plurality of bit line lines a horizontal cross-section in a shape of a semicircle, and a width of each of the plurality of bit lines in the second horizontal direction decreases in a direction away from the first sidewall of a corresponding one of the plurality of spacers.

16. The semiconductor memory device of claim 11, wherein a buried insulating layer extending in the vertical direction is adjacent to the first sidewall of a corresponding one of the plurality of spacers with a corresponding one of the bit lines therebetween.

17. The semiconductor memory device of claim 16, wherein a width of the buried insulating layer in the second horizontal direction is greater than the first width, and a sidewall of the bit line is recessed in the second horizontal direction with respect to a sidewall of the buried insulating layer and the first sidewall of a corresponding one of the plurality of spacers.

18. The semiconductor memory device of claim 11, further comprising:

a shield layer between two adjacent ones of the plurality of bit lines, the shield layer including air or a low-k material.

19. A semiconductor memory device comprising:

a plurality of transistor bodies spaced apart from each other in a vertical direction on a substrate and extending parallel to each other in a first horizontal direction, each of the plurality of transistor bodies including a first source/drain region, a single-crystal channel layer including single-crystal silicon, and a second source/drain region sequentially arranged in the first horizontal direction, each of the plurality of transistor bodies having a protrusion with a planar shape convexly protruding in a second horizontal direction orthogonal to the first horizontal direction, a part of each of the plurality of transistor bodies being a part of the single-crystal channel layer;

a plurality of bit lines spaced apart from each other in the second horizontal direction on the substrate and extending parallel to each other in the vertical direction, each of the plurality of bit lines connected to the first source/drain region of a corresponding one of the plurality of transistor bodies, each of the plurality of bit lines having a first width in the second horizontal direction;

a plurality of word lines spaced apart from each other along the vertical direction and extending parallel to each other in the second horizontal direction, the plurality of word lines having a gate insulating layer therebetween, and each of the plurality of word lines covering at least an upper surface of the single-crystal channel layer of a corresponding one of the plurality of transistor bodies or a lower surface of the single-crystal channel layer of a corresponding one of the plurality of transistor bodies;

a spacer covering upper and lower surfaces of the first source/drain region and having a second width in the second horizontal direction that is greater than the first width; and a plurality of cell capacitors each including a first electrode connected to the second source/drain region of a corresponding one of the plurality of transistor bodies, a second electrode covering the first electrode, and a capacitor dielectric layer between the first electrode and the second electrode.

* * * * *